US012753777B2

(12) United States Patent
Zarli et al.

(10) Patent No.: US 12,753,777 B2
(45) Date of Patent: Oct. 6, 2026

(54) MOUNTING DEVICE FOR A FAN UNIT

(71) Applicant: Spectronik Pte. Ltd., Singapore (SG)

(72) Inventors: Maung Maung Zarli, Singapore (SG); Jun Jia Liew, Singapore (SG); Hao Shen, Singapore (SG); Jogjaman Jap, Singapore (SG)

(73) Assignee: Spectronik Pte. Ltd., Singapore (SG)

( * ) Notice: Subject to any disclaimer, the term of this patent is extended or adjusted under 35 U.S.C. 154(b) by 0 days.

(21) Appl. No.: 18/786,139

(22) Filed: Jul. 26, 2024

(65) Prior Publication Data

US 2024/0384731 A1 Nov. 21, 2024

Related U.S. Application Data

(63) Continuation of application No. 17/198,076, filed on Mar. 10, 2021, now Pat. No. 12,092,132.

(30) Foreign Application Priority Data

Mar. 5, 2021 (SG) ...................... SG10202102291U

(51) Int. Cl.

| | |
|---|---|
| ***F04D 29/64*** | (2006.01) |
| ***F04D 17/16*** | (2006.01) |
| ***F04D 19/00*** | (2006.01) |
| ***F04D 29/60*** | (2006.01) |
| ***F04D 29/62*** | (2006.01) |

(Continued)

(52) U.S. Cl.

CPC ......... *F04D 29/646* (2013.01); *F04D 29/601* (2013.01); *F04D 29/626* (2013.01); *H01M 8/04014* (2013.01); *H05K 7/20172* (2013.01); *F04D 17/16* (2013.01); *F04D 19/002* (2013.01)

(58) Field of Classification Search

CPC .. H05K 5/0013; H05K 7/20172; F04D 17/16; F04D 19/002; F04D 29/646; F04D 29/601; H01M 7/04014

See application file for complete search history.

(56) References Cited

U.S. PATENT DOCUMENTS 7,654,792 B2 * 2/2010 Kikuichi ............... F04D 29/601 415/214.1
9,897,094 B2 * 2/2018 Kang .................... F04D 29/522

(Continued)

FOREIGN PATENT DOCUMENTS

CN 2793937 Y * 7/2006
CN 101281978 A * 10/2008

(Continued)

*Primary Examiner* — Ryan C Clark

(74) *Attorney, Agent, or Firm* — Eric D. Babych; Barnes & Thornburg LLP

(57) ABSTRACT

The present disclosure generally relates to a mounting device for mounting a fan unit. The mounting device may include a reference plane and a reference axis normal to the reference plane, the fan unit in a disengaged orientation being receivable towards the reference plane along the reference axis. The device may also include a set of engagement members radially disposed around the reference axis and arranged to surround the fan unit in the disengaged orientation at the reference plane, the engagement members engageable with the fan unit upon actuation of the fan unit planarly along the reference plane from the disengaged orientation to an engaged orientation.

19 Claims, 16 Drawing Sheets

(51) Int. Cl.
*H01M 8/04014* (2016.01)
*H05K 7/20* (2006.01)

(56) References Cited

U.S. PATENT DOCUMENTS

| | | | | |
|---|---|---|---|---|
| 2007/0268665 | A1* | 11/2007 | Chen | H05K 7/20172 361/695 |
| 2009/0022587 | A1* | 1/2009 | Yoshida | F04D 25/166 415/213.1 |
| 2012/0325431 | A1* | 12/2012 | Xia | H01L 23/4006 165/67 |
| 2014/0035413 | A1* | 2/2014 | Cowdry | H02K 5/24 310/91 |
| 2014/0147313 | A1* | 5/2014 | Deng | H05K 7/20172 417/423.15 |
| 2018/0080479 | A1* | 3/2018 | Yang | F04D 29/023 |
| 2018/0362124 | A1* | 12/2018 | Norton | B63B 32/40 |
| 2020/0231803 | A1* | 7/2020 | Amiel-Levy | G03F 7/032 |
| 2020/0236812 | A1* | 7/2020 | Smith | H05K 7/20445 |
| 2020/0392964 | A1* | 12/2020 | Hwang | F04D 29/4253 |
| 2021/0197735 | A1* | 7/2021 | Nardella, Sr. | C09J 153/02 |
| 2021/0277916 | A1* | 9/2021 | Ma | F04D 19/007 |

FOREIGN PATENT DOCUMENTS

| | | | | |
|---|---|---|---|---|
| CN | 211845794 | U * | 11/2020 | |
| WO | WO-2013018125 | A1 * | 2/2013 | H01M 8/2465 |
| WO | WO-2013114800 | A1 * | 8/2013 | H01M 8/04171 |
| WO | WO-2013136642 | A1 * | 9/2013 | F04D 29/601 |

* cited by examiner

MOUNTING DEVICE FOR A FAN UNIT

TECHNICAL FIELD

The present disclosure generally relates to a mounting device for a fan unit. More particularly, the present disclosure describes various embodiments of the mounting device, a method of using the mounting device to mount the fan unit, and an apparatus comprising the mounting device having the fan unit mounted thereto.

BACKGROUND

Axial and radial fans are generally used for various ventilation and/or cooling applications, such as in computers. These fans are generally designed with a housing frame that supports the fan blades and has mounting holes for mounting the fan to another body, such as a computer motherboard or an enclosure for a machine that generates heat when operating. These mounting holes are usually positioned at the outer corners or vertices of the housing frame and surrounding the fan blades.

The fan may be mounted to the body via single-face where the front or back of the fan is fastened to the body, or via dual-face where both the front and back of the fan are fastened to the body. More particularly, the fan is fastened to the body using standard fasteners, such as screws or bolts and nuts, through the mounting holes of the fan.

One problem with these threaded fasteners is that it is time consuming to mount the fan to the body as each mounting hole must be secured with a respective fastener. Another problem is that operation of the fan causes vibrations, which can cause the threaded fasteners to gradually move, either tightening or loosening the fastener. In some cases, this can lead to the complete unfastening of the fastener, which can cause malfunction of the fan or computer that requires cooling by the fan. For example, the computer could overheat if the fan's alignment changes due to loss of a fastening point, or the loose screw or bolt could fall into the fan or other component and cause damage.

Therefore, in order to address or alleviate at least one of the aforementioned problems and/or disadvantages, there is a need to provide an improved mounting device for a fan unit.

SUMMARY

According to a first aspect of the present disclosure, there is a mounting device for mounting a fan unit, the mounting device comprising:

- a reference plane and a reference axis normal to the reference plane, the fan unit in a disengaged orientation being receivable towards the reference plane along the reference axis;
- a set of engagement members radially disposed around the reference axis and arranged to surround the fan unit in the disengaged orientation at the reference plane, the engagement members engageable with the fan unit upon actuation of the fan unit planarly along the reference plane from the disengaged orientation to an engaged orientation; and
- a set of engagement elements disposed on the engagement members, the engagement elements engageable with a set of mounting holes of the fan unit upon actuation of the fan unit to the engaged orientation,

- wherein upon engagement with the fan unit, the engaged engagement members and engagement elements resist movement of the fan unit relative to the mounting device.

According to a second aspect of the present disclosure, there a method of mounting a fan unit to a mounting device, the method comprising:

- displacing the fan unit in a disengaged orientation and along a reference axis towards a reference plane of the mounting device, the reference axis being normal to the reference plane;
- surrounding the fan unit in the disengaged orientation at the reference plane with a set of engagement members of the mounting device radially disposed around the reference axis;
- actuating the fan unit planarly along the reference plane from the disengaged orientation to an engaged orientation;
- engaging the engagement members with the fan unit upon the fan unit being actuated to the engaged orientation; and
- engaging a set of engagement elements of the mounting device with a set of mounting holes of the fan unit upon actuation of the fan unit to the engaged orientation, the engagement elements disposed on the engagement members,
- wherein the engaged engagement members and engagement elements resist movement of the fan unit relative to the mounting device.

According to a third aspect of the present disclosure, there a fan-mounted product comprising:

- a body;
- a mounting device joined to the body;
- a fan unit mounted to the mounting device, the fan unit comprising a set of mounting holes;
- the mounting device comprising:
  - a reference plane and a reference axis normal to the reference plane;
  - a set of engagement members radially disposed around the reference axis and surrounding the fan unit in an engaged orientation at the reference plane, the engagement members engaged with the fan unit;
  - a set of engagement elements disposed on the engagement members and engaged with the mounting holes of the fan unit;
- wherein the engaged engagement members and engagement elements resist movement of the fan unit relative to the mounting device;
- wherein the fan unit is disengageable by actuating the fan unit planarly along the reference plane from the engaged orientation to a disengaged orientation; and
- wherein the fan unit is removable from the mounting device by displacing the fan unit in the disengaged orientation along the reference axis away from the reference plane.

A mounting device for a fan unit according to the present disclosure are thus disclosed herein. Various features, aspects, and advantages of the present disclosure will become more apparent from the following detailed description of the embodiments of the present disclosure, by way of non-limiting examples only, along with the accompanying drawings.

DETAILED DESCRIPTION

Figure 1A:
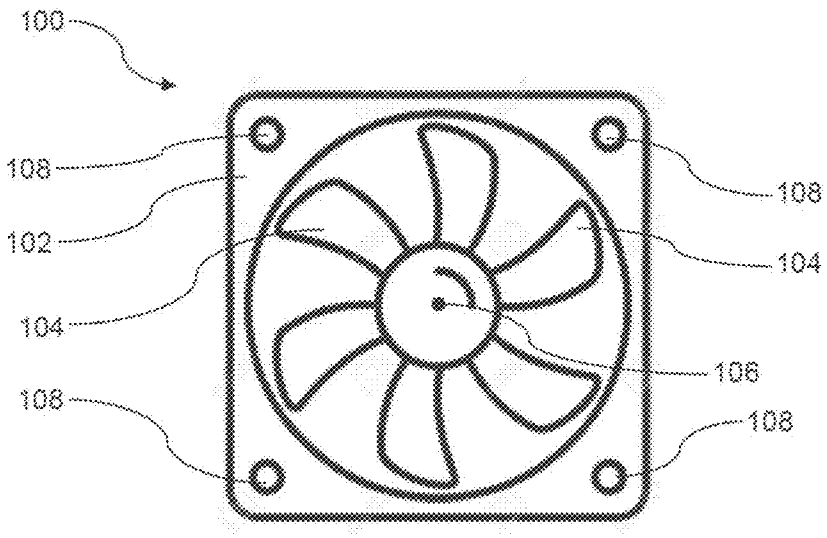
FIG. 1A to FIG. 1C are various illustrations of a fan unit.

For purposes of brevity and clarity, descriptions of embodiments of the present disclosure are directed to a mounting device for a fan unit, in accordance with the drawings. While aspects of the present disclosure will be described in conjunction with the embodiments provided herein, it will be understood that they are not intended to limit the present disclosure to these embodiments. On the contrary, the present disclosure is intended to cover alternatives, modifications and equivalents to the embodiments described herein, which are included within the scope of the present disclosure as defined by the appended claims. Furthermore, in the following detailed description, specific details are set forth in order to provide a thorough understanding of the present disclosure. However, it will be recognised by an individual having ordinary skill in the art, i.e. a skilled person, that the present disclosure may be practiced without specific details, and/or with multiple details arising from combinations of aspects of particular embodiments. In a number of instances, well-known systems, methods, procedures, and components have not been described in detail so as to not unnecessarily obscure aspects of the embodiments of the present disclosure.

In embodiments of the present disclosure, depiction of a given element or consideration or use of a particular element number in a particular figure or a reference thereto in corresponding descriptive material can encompass the same, an equivalent, or an analogous element or element number identified in another figure or descriptive material associated therewith.

References to "an embodiment/example", "another embodiment/example", "some embodiments/examples", "some other embodiments/examples", and so on, indicate that the embodiment(s)/example(s) so described may include a particular feature, structure, characteristic, property, element, or limitation, but that not every embodiment/example necessarily includes that particular feature, structure, characteristic, property, element or limitation. Furthermore, repeated use of the phrase "in an embodiment/example" or "in another embodiment/example" does not necessarily refer to the same embodiment/example.

The terms "comprising", "including", "having", and the like do not exclude the presence of other features/elements/steps than those listed in an embodiment. Recitation of certain features/elements/steps in mutually different embodiments does not indicate that a combination of these features/elements/steps cannot be used in an embodiment.

As used herein, the terms "a" and "an" are defined as one or more than one. The use of "/" in a figure or associated text is understood to mean "and/or" unless otherwise indicated.

The term "set" is defined as a non-empty finite organisation of elements that mathematically exhibits a cardinality of at least one (e.g. a set as defined herein can correspond to a unit, singlet, or single-element set, or a multiple-element set), in accordance with known mathematical definitions. The terms "first", "second", etc. are used merely as labels or identifiers and are not intended to impose numerical requirements on their associated terms.

In representative or exemplary embodiments of the present disclosure, with reference to FIG. 1A, there is a fan unit 100 to be mounted to a body for creating air flow in/to the body. For example, a computer has many electronic components, such as the processing unit (CPU) and heat sink, that generate heat during operation. The fan unit 100 may be a computer fan that is mountable to the body of the computer, such as the motherboard or computer casing, for creating air flow or ventilation in the computer. This air flow facilitates dissipation of the heat from the electronic components, thereby cooling the computer.

Figure 1B:
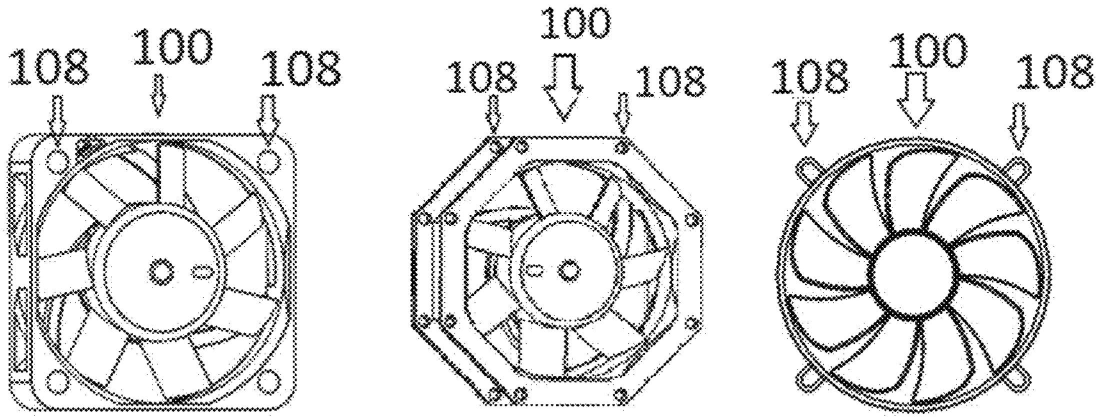
Figure 1C:
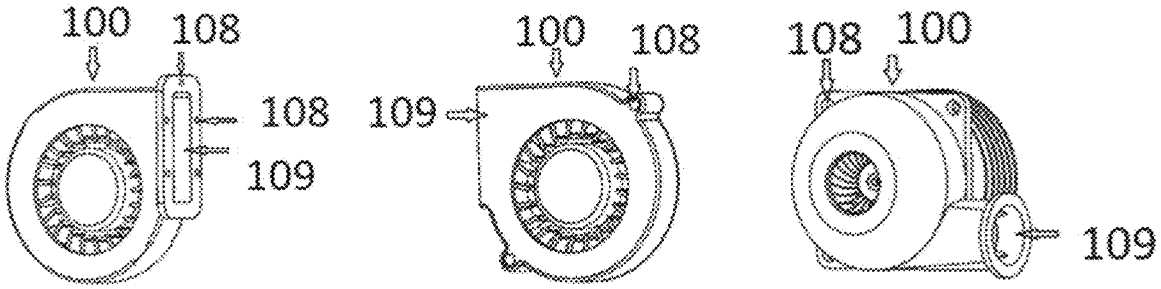

The fan unit 100 includes a housing frame or fan frame 102 and a plurality of fan blades 104 rotatable about a fan axis 106. The fan blades 104 are structurally connected to and supported by the fan frame 102. The fan frame 102 includes a pivoting mechanism, such as a spindle, collinear with the fan axis 106 for rotation of the fan blades 104. The fan unit 100 further includes a number of, i.e. one or more, mounting holes 108 for mounting the fan unit 100 to another body, such as the computer motherboard or casing. The mounting holes 108 are positioned at the outer corners or vertices of the fan frame 102 and the mounting holes 108 surround the fan blades 104. The fan unit 100 can be an axial fan as shown in FIG. 1B, or the fan unit 100 can be other types of fans, such as radial or centrifugal fans as shown in FIG. 1C. For example, a radial fan unit 100 has an air outlet directed away from the fan blades 104.

Figure 2:
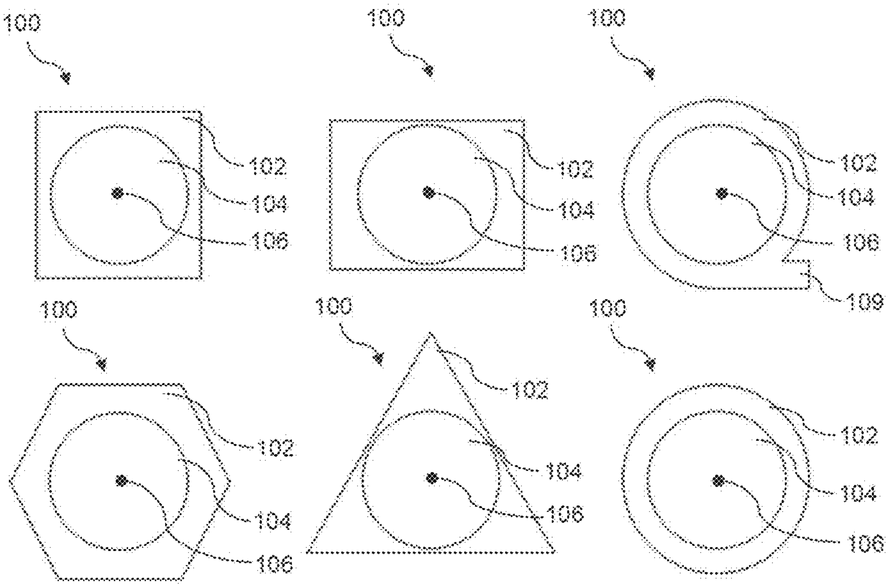
FIG. 2 is an illustration of the fan unit having various shapes of a fan frame of the fan unit.

The fan frame 102 preferably has a convex polygon shape or profile, but may have a circular shape in some cases. More specifically, at least the face of the fan frame 102 that faces and mounts to the body has a convex polygon shape. A convex polygon shape has at least three straight sides and there is no line segment between any two points on the sides of the polygon that goes outside the polygon. More preferably, the convex polygon shape of the fan frame 102 is equiangular and the mounting holes 108 are situated at the corners or vertices of the polygon. FIG. 2 illustrates various examples of the fan unit 100 having fan frames 102 of different shapes, including convex polygon shapes and circular shapes.

Figure 3A:
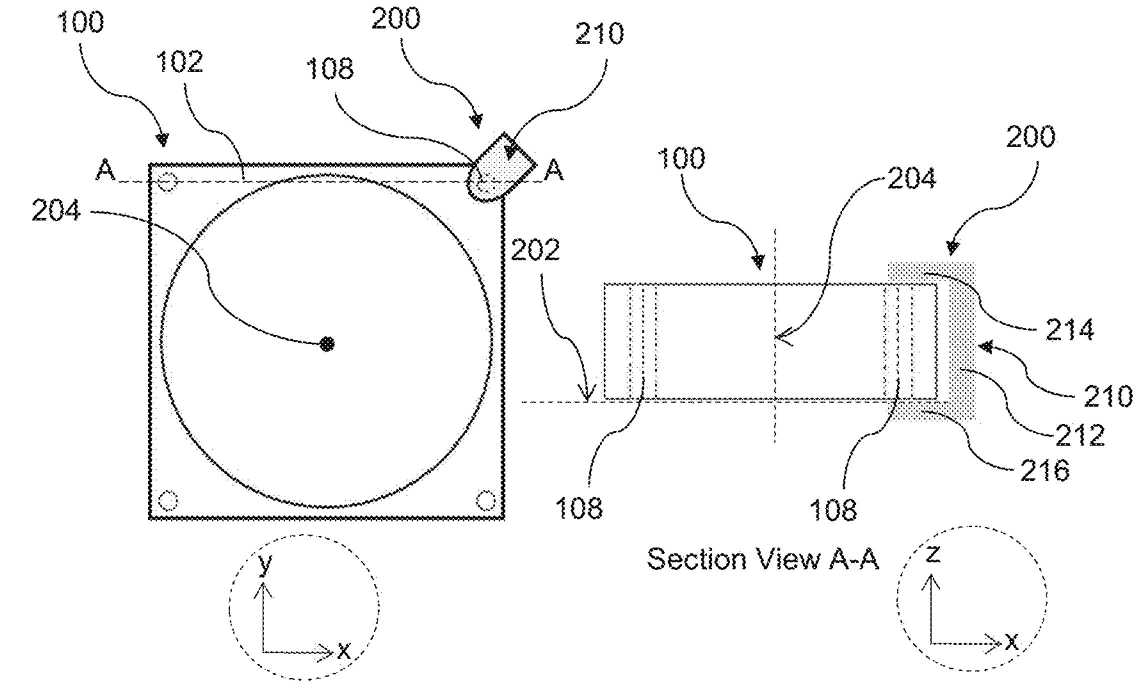
FIG. 3A and FIG. 3B are illustrations of the fan unit mounted to a mounting device according to embodiments of the present disclosure.
Figure 3B:
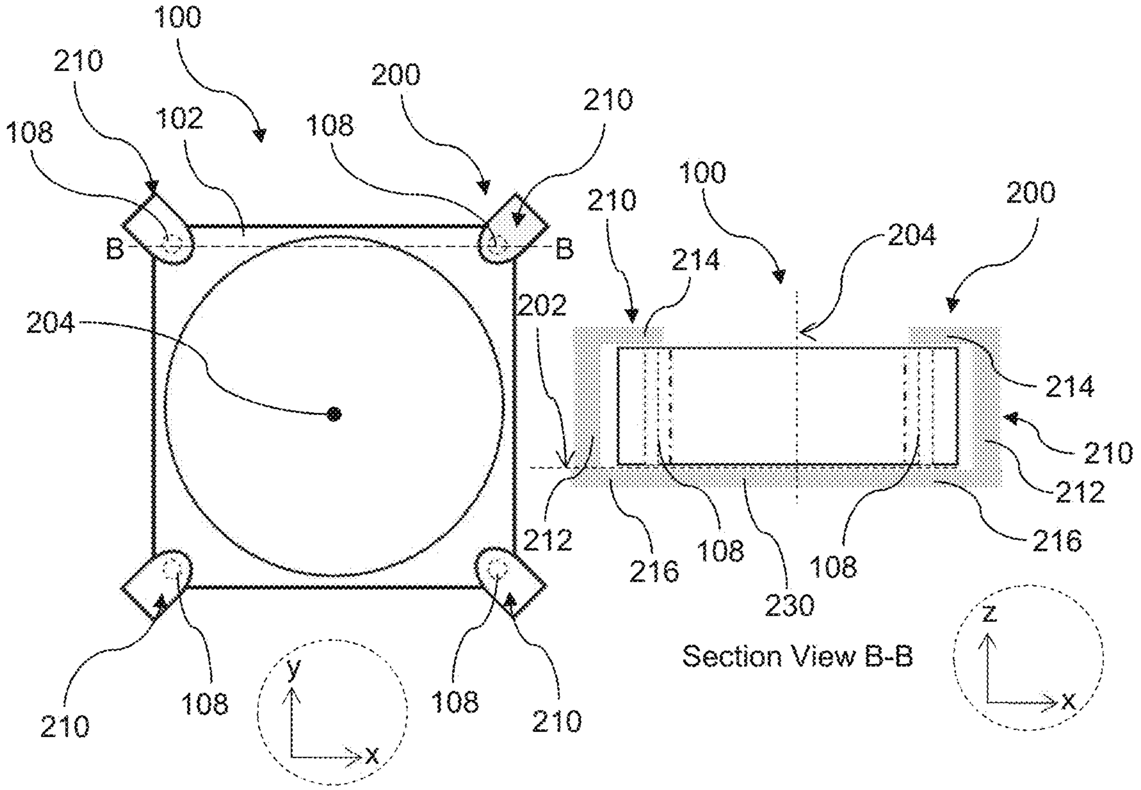

In various embodiments of the present disclosure, with reference to FIG. 3A and FIG. 3B, there is a mounting device 200 for mounting the fan unit 100. The mounting device 200 includes a reference plane 202 and a reference axis 204 is defined as being normal or perpendicular to the reference plane 202. The fan unit 100 is receivable towards the reference plane 202 along the reference axis 204 which may be referred to as the z axis. More specifically, when the fan unit 100 is being mounted to the mounting device 200, the fan unit 100 is in a first orientation relative to the reference axis 204 and is displaced or moved along the reference axis 204 towards the reference plane 202. During this linear displacement along the reference axis 204, one face of the fan unit 100, such as the bottom face, faces the reference plane 202.

The mounting device 200 further includes a set of one or more engagement members 210 radially disposed around the reference axis 204. The engagement members 210 are arranged to surround the fan unit 100 in the first orientation at the reference plane 202. Further, the engagement members 210 are engageable with the fan unit 100 upon actuation of the fan unit 100 planarly along the reference plane 202 from the first orientation to a second orientation relative to the reference axis 204. As an example, upon actuating the fan unit 100 to the second orientation, each engagement member 210 is engaged one or more faces of the fan unit 100 (such as the top and/or bottom faces) and at a respective outer corner or vertex of the fan frame 102 where a corresponding mounting hole 108 is positioned. Actuating the fan unit 100 planarly along the reference plane 202 means the fan unit 100 remains at the reference plane 202 and is actuated along the xy plane, such as by rotation about the reference axis 204.

The second orientation may be referred to as the engaged orientation because the fan unit 100 is engaged with the engagement members 210. The first orientation may be referred to as the disengaged orientation because the fan unit 100 is not yet engaged with, or has been disengaged from, the engagement members 210. The disengaged and engaged orientations are relative to the reference axis 204 as the actuation between both orientations occurs planarly along the reference plane 202 or xy plane.

In some embodiments, the mounting device 200 includes a plurality of engagement members 210 angularly separated from each other about the reference axis 204. The multiple engagement members 210 are distributed around the perimeter of the fan frame 102, thereby stabilizing the mounting of the fan unit 100 to the mounting device 200. The multiple engagement members 210 are engageable with the fan unit 100 and at different parts of the fan unit 100 upon actuation of the fan unit 100 to the second orientation or engaged orientation.

As shown in FIG. 3A, the fan unit 100 has a square shape and is mounted to the mounting device 200 via an engagement member 210. Although FIG. 3A shows one exemplary engagement member 210 engaged at one corner of the fan frame 102, the mounting device 200 may have at least one other angularly separated engagement member 210 engaged at at least one other part or corner of the fan frame 102. In one example, the mounting device 200 has two engagement members 210 engaged at diametrically opposite corners of the fan frame 102. In another example, the mounting device 200 has four engagement members 210 engaged at every corner of the fan frame 102. It will be appreciated that the number of engagement members 210 may vary according to the number of sides, corners, and/or convex polygon shape of the fan frame 102. In some cases, the fan frame 102 has a circular shape and the mounting holes 108 are positioned outside the fan frame 102, such as extending from the fan frame 102, to enable the fan unit 100 to be mounted to the mounting device 200.

The engagement member 210 includes a side wall 212 and at least one bracket extending from the side wall 212 for engagement with a respective face of the fan unit 100. In one embodiment, the engagement member 210 has a side wall 212 and a top bracket 214 extending from the side wall 212 for engagement with the top face of the fan unit 100. In another embodiment, the engagement member 210 has the side wall 212 and a bottom bracket 216 extending from the side wall 212 for engagement with the bottom face of the fan unit 100. In another embodiment and as shown in FIG. 3A, the engagement member 210 is in the form of a C-shaped clamp and has both the top bracket 214 and bottom bracket 216 extending from the side wall 212 for engagement with both the top and bottom faces of the fan unit 100.

The reference plane 202 may be coplanar with a base surface of the mounting device 200. The base surface may be formed on the surfaces of the bottom brackets 216 that engage with the bottom face of the fan unit 100, such as shown in FIG. 3A. In some embodiments as shown in FIG. 3B, the mounting device 200 may include a base member 230 whereon the base surface is formed. The engagement members 210 are joined to the base member 230, such as by coupling to or integrally forming with the base member 230. For example, the base member 230 is joined to the bottom brackets 216 and the base surface is formed on their respective surfaces. In some embodiments, the engagement members 210 are absent the bottom brackets 216 and base member 230, and the reference plane 202 may be coplanar with a mounting surface of the body which the fan unit 100 and mounting device 200 are joined to.

Figure 4:
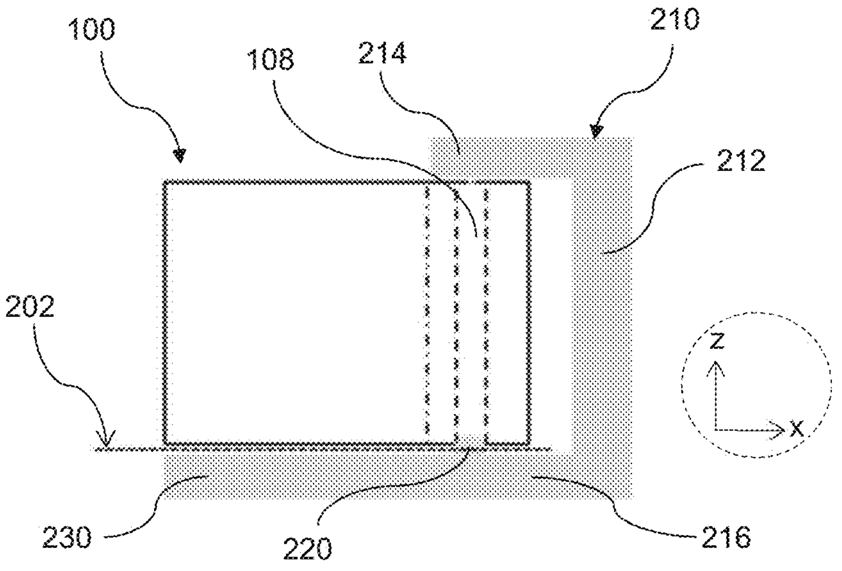
FIG. 4 and FIG. 5 are illustrations of various configurations of an engagement member of the mounting device.

Preferably, as shown in FIG. 4, the top bracket 214 and bottom bracket 216 abut the top and bottom faces, respectively, of the fan unit 100. This ensures proper fitting and mounting of the fan unit 100 and minimizes formation of gaps between the respective bracket 214/216 and the respective face. Such gaps could compromise the dynamics of the air flow created by the fan unit 100. This configuration thus improves the air flow dynamics and mitigates the tendency of vibrations produced by the fan unit 100 during operation.

In some embodiments, the mounting device 200 has two engagement members 210 engaged at diametrically opposite corners of the fan frame 102. In one embodiment, one engagement member 210 has the top bracket 214 engaged with the top face of the fan unit 100 and the other engagement member 210 has the bottom bracket 216 engaged with the bottom face of the fan unit 100. In another embodiment, one engagement member 210 has either the top bracket 214 or bottom bracket 216 and the other engagement member 210 has both the top bracket 214 and bottom bracket 216. In another embodiment, both engagement members 210 have both the top bracket 214 and bottom bracket 216.

In some embodiments, the mounting device 200 has three engagement members 210 engaged at three corners of the fan frame 102. In one embodiment, a first engagement member 210 has the top bracket 214, a second engagement member 210 has the bottom bracket 216, and a third engagement member 210 has both the top bracket 214 and bottom bracket 216. In another embodiment, the first and second engagement members 210 have both the top bracket 214 and bottom bracket 216, and the third engagement member 210 has either the top bracket 214 or bottom bracket 216. In another embodiment, each engagement member 210 has both the top bracket 214 and bottom bracket 216.

Although various embodiments herein describe engagement members 210 having top brackets 214 and bottom brackets 216, i.e. in a top-bottom arrangement, it will be appreciated that the engagement members 210 may have other arrangements. These arrangements may depend on the arrangement of the fan unit 100 when mounted to the mounting device 200. For example, the engagement members 210 may have left-right arrangement with corresponding left and right brackets, or a front-back arrangement with corresponding front and back brackets.

The mounting device 200 further includes a set of one or more engagement elements 220 disposed on the engagement members 210. The engagement elements 220 are engageable with a set of one or more mounting holes 108 of the fan unit 100 upon actuation of the fan unit 100 from the first orientation to the second orientation, i.e. from the disengaged orientation to the engaged orientation. An engagement element 220 may be in the form of a bump or protrusion that can be fitted into and/or interlocked with a mounting hole 108.

Figure 5:
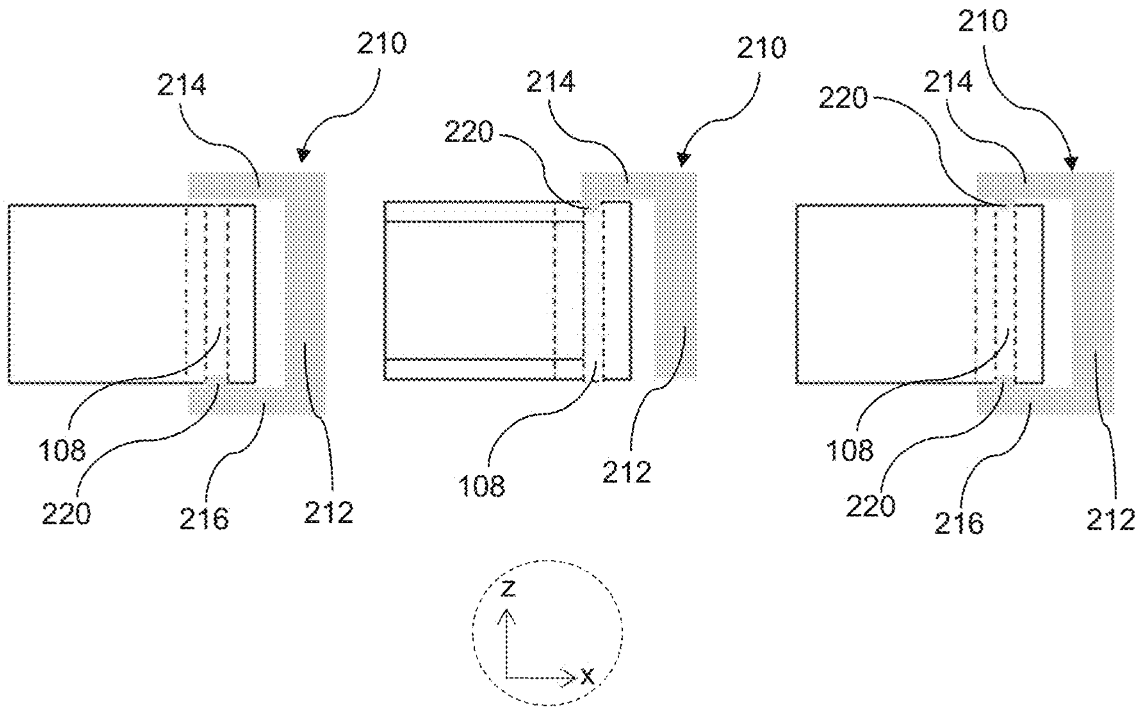

With reference to FIG. 5, in one embodiment, the engagement member 210 has an engagement element 220 disposed on the bottom bracket 216. In another embodiment, the engagement member 210 has an engagement element 220 disposed on the top bracket 214. In another embodiment, the engagement member 210 has two engagement elements 220—one disposed on the top bracket 214 and the other disposed on the bottom bracket 216.

When the fan unit 100 is being actuated planarly along the reference plane 202 from the disengaged orientation to the engaged orientation, the engagement elements 220 obstruct and interfere with the actuation. Some force is necessary to overcome this resistance and force the engagement elements 220 to fit into and/or interlock with the mounting holes 108. The level of force required to overcome this resistance is dependent on the dimensions and material of the engagement members 210 and engagement elements 220.

In some embodiments, the mounting device 200 includes a plurality of engagement elements 220 angularly separated from each other about the reference axis 204. The multiple engagement elements 220 are engageable with a plurality of mounting holes 108 of the fan unit 100 upon actuation of the fan unit 100 to the engaged orientation, thereby stabilizing the mounting of the fan unit 100 to the mounting device 200.

In some embodiments, the mounting device 200 has one engagement member 210 engaged at one corner of the fan frame 102. The engagement member 210 has the top bracket 214 and bottom bracket 216 engaged with the top and bottom faces of the fan unit 100. In one embodiment, the engagement member 210 has one engagement element 220 disposed on the top bracket 214 or bottom bracket 216. In another embodiment, the engagement member 210 has two engagement elements 220 disposed on both the top bracket 214 and bottom bracket 216. The engagement member 210 engaged with the top and bottom faces resists movement of the fan unit 100 along the reference axis 204 (z axis). The engagement element(s) 220 is engaged with one mounting hole 108 of the fan unit 100 and resists movement of the fan unit 100 planarly along the reference plane 202 (xy plane). Preferably, the mounting hole 108 has a non-circular shape or profile and the engagement element(s) 220 fits snugly within the mounting hole 108. This would prevent or reduce the tendency of the fan unit 100 rotating about an axis through the engagement element(s) 220 and mounting hole 108.

In some embodiments, the mounting device 200 has two engagement members 210 engaged at two corners, such as diametrically opposite corners, of the fan frame 102, each corner having a respective mounting hole 108. One engagement member 210 has the top bracket 214 engaged with the top face of the fan unit 100 and the other engagement member 210 has the bottom bracket 216 engaged with the bottom face of the fan unit 100. Each of the top bracket 214 and bottom bracket 216 includes a respective engagement element 220 engaged with both mounting holes 108 of the fan unit 108. The engagement members 210 engaged with the top and bottom faces resist movement of the fan unit 100 along the reference axis 204 (z axis). The engagement elements 220 engaged with the mounting holes 108 resist movement of the fan unit 100 along the reference plane 202 (xy plane).

Therefore, the mounting device 200 has one or more engagement members 210 and one or more engagement elements 220 engageable with the fan unit 100. Upon actuation of the fan unit 100 to the engaged orientation, the engagement members 210 engage with the fan unit 100 and the engagement elements 220 engage with one or more mounting holes 108 of the fan unit 100. Upon engagement with the fan unit 100, the engaged engagement members 210 and engagement elements 220 resist movement of the fan unit 100 relative to the mounting device 100. Particularly, the arrangement of the top bracket(s) 214 and bottom bracket(s) 216 of the engagement members 210 resist the fan unit 100 from moving along the reference axis 204 (z axis). Additionally, the engagement elements 220 fitted into and/or interlocked with the mounting holes 108 resist the fan unit 100 from moving planarly along the reference plane 202 (xy plane).

The engagement members 210 and engagement elements 220 thus securely mount the fan unit 100 to the mounting device 200 without using conventional threaded fasteners like screws, bolts, and nuts. As there are no threaded fasteners, there is no risk of unintended tightening or loosening of the fasteners which might happen due to vibrations that are produced during normal operation of the fan unit 100. There is minimal risk of the fan unit 100 becoming unsecured due to these vibrations.

Figure 6:
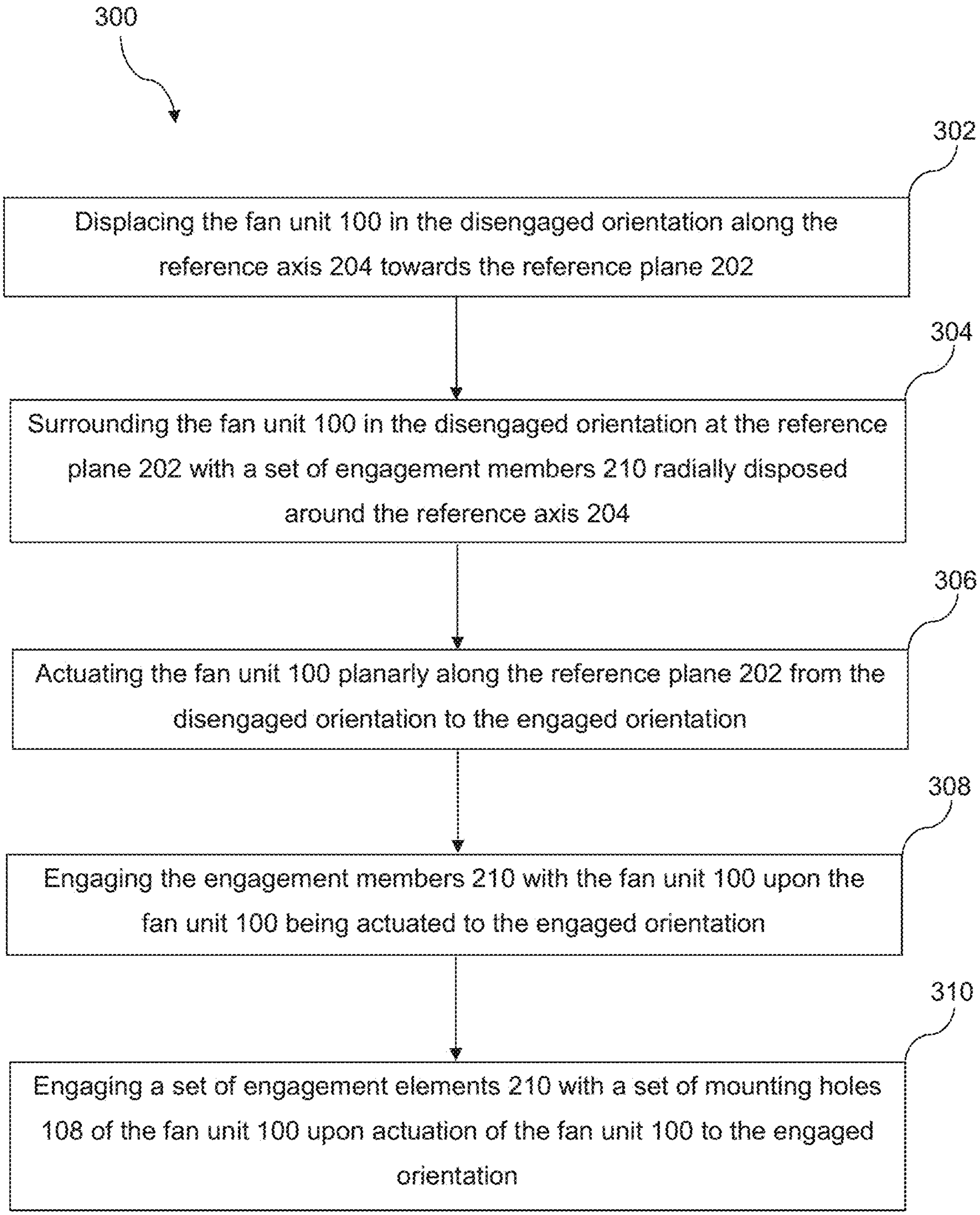
FIG. 6 is a flowchart illustration of a method for mounting the fan unit to the mounting device.

In various embodiments with reference to FIG. 6, there is a method 300 of mounting the fan unit 100 to the mounting device 200. The method 300 includes a step 302 of displacing the fan unit 100 in the disengaged orientation along the reference axis 204 towards the reference plane 202. The method 300 includes a step 304 of surrounding the fan unit 100 in the disengaged orientation at the reference plane 202 with a set of one or more engagement members 210 radially disposed around the reference axis 204. The method 300 includes a step 306 of actuating the fan unit 100 planarly along the reference plane 202 from the disengaged orientation to the engaged orientation.

The fan unit 100 remains in the disengaged orientation during displacement along the reference axis 204 towards the reference plane 202. Further, if the fan unit 100 is in the engaged orientation, the arrangement of the engagement members 210 would prevent the fan unit 100 in the engaged orientation from being displaced towards the reference plane 202. When the fan unit 100 in the disengaged orientation reaches the reference plane 202, such as when the bottom face of the fan unit 100 mates with the base surface of the mounting device 200, the fan unit 100 is actuated from the disengaged orientation to the engaged orientation.

The method 300 includes a step 308 of engaging the engagement members 210 with the fan unit 100 upon the fan unit 100 being actuated to the engaged orientation. The method 300 includes a step 310 of engaging a set of one or more engagement elements 210 with a set of one or more mounting holes 108 of the fan unit 100 upon actuation of the fan unit 100 to the engaged orientation. The engaged engagement members 210 and engagement elements 220 resist movement of the fan unit 100 relative to the mounting device 200.

The method 300 thus describe a two-stage approach for mounting the fan unit 100 to the mounting device 200. The first stage is a linear displacement of the fan unit 100 along the reference axis 204 to the reference plane 202 and the fan unit 100 remains in the disengaged orientation during this displacement. The second stage is a planar displacement of the fan unit 100 along the reference plane 202 from the disengaged orientation to the engaged orientation. An advantage of this method 300 is that the fan unit 100 can be easily and quickly mounted to the mounting device 200 without fumbling with threaded fasteners which are conventionally fastened through all the mounting holes 108. Moreover, this two-stage method 300 can be performed by a user using just one hand, as opposed to having to use two hands to work with screwdrivers, screws, bolts, and nuts for the conventional threaded fasteners.

Figure 7:
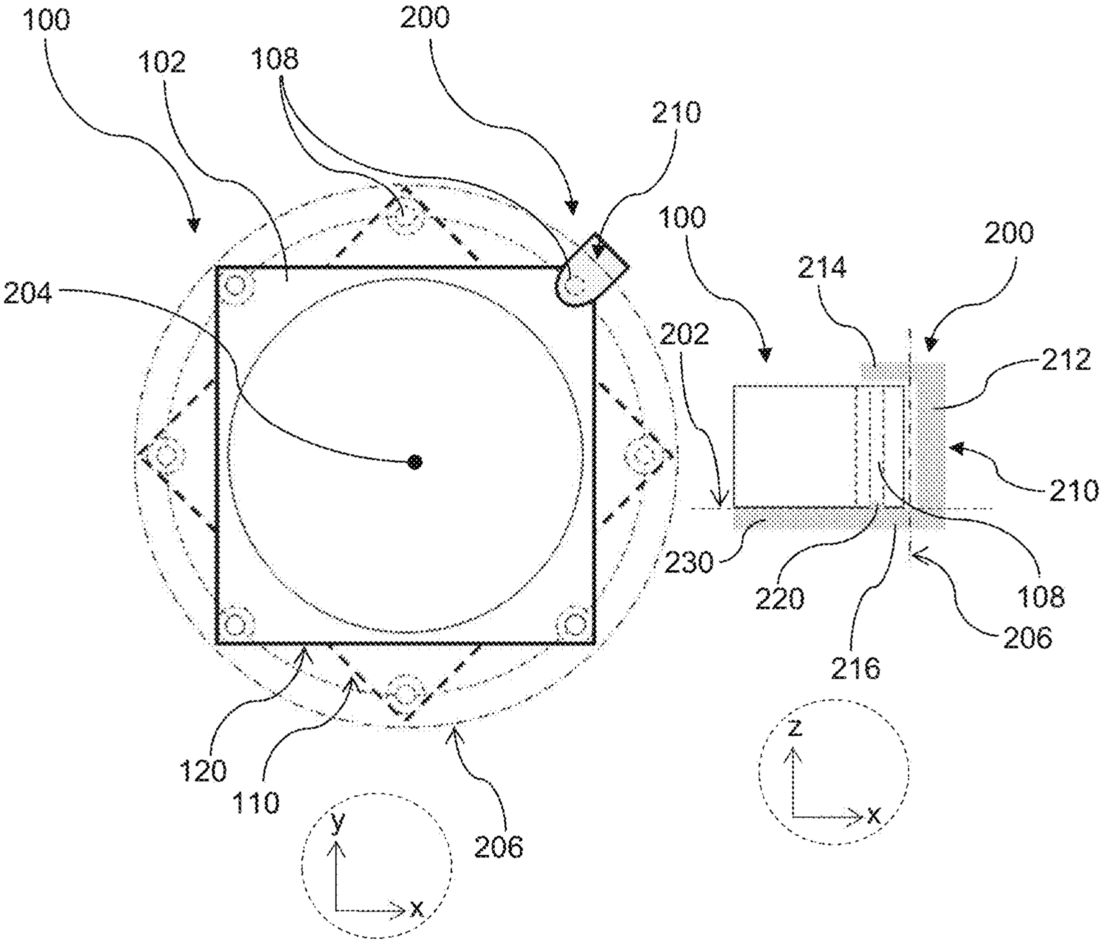
FIG. 7 is an illustration of the fan unit being mounted to the mounting device.

In some embodiments with reference to FIG. 7, the fan unit 100 is actuatable planarly along the reference plane 202 by rotation of the fan unit 100 about the reference axis 204. Preferably, the fan axis 106 is collinear with the reference axis 204. The fan unit 100 is rotatable around a circumference 206 defined by the reference axis 204. Notably, the circumference 206 circumscribes the outer corners or vertices of the fan frame 102.

Figure 8A:
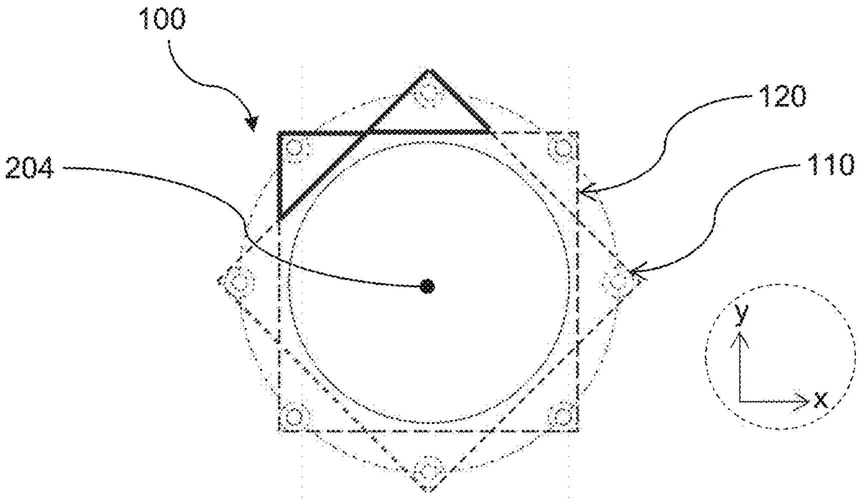
FIG. 8A to FIG. 8C are illustrations of the fan unit of various fan frame shapes being mounted to the mounting device.
Figure 8B:
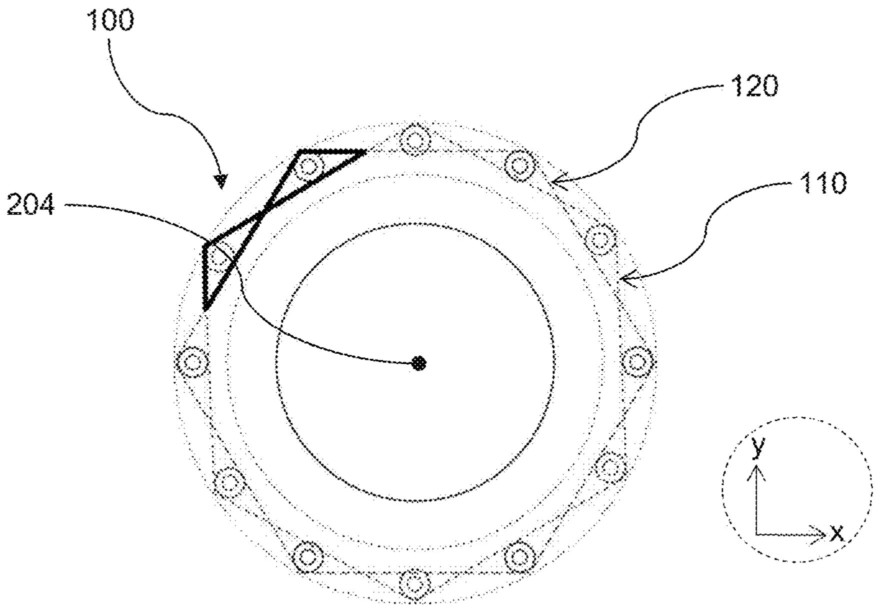
Figure 8C:
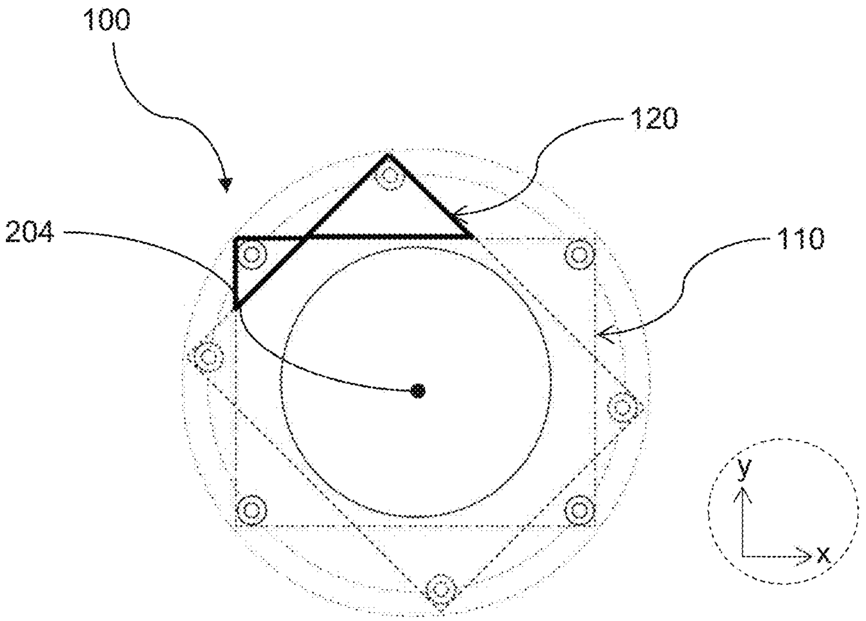

As shown in FIG. 7, in the disengaged orientation 110, the mounting holes 108 of the fan unit 100 are positioned away from the engagement member 210. When the fan unit 100 is rotated about the reference axis 204 to the engaged orientation 120, one of the mounting hole 108 is aligned to the engagement member 210. The engagement member 210 and the engagement element 220 disposed thereon engage the aligned mounting hole 108 of the fan unit 100. In the engaged orientation 120, the engaged engagement member 110 resists movement of the fan unit 100 along the reference axis 204, and the engaged engagement element 220 resists movement of the fan unit 100 along the reference plane 202. FIG. 8A to FIG. 8C illustrates embodiments of the fan unit 100 having various shapes, such as square, hexagon, and rectangle, and rotated between the disengaged orientation 110 and engaged orientation 120.

The mounting device 200 may include side surfaces for guiding rotation of the fan unit 100 about the reference axis 204. For example, the side surfaces may be formed on the inner surfaces of the side walls 212 of the engagement members 210. The engagement members 210 are positioned such that the side surfaces reside marginally outside the circumference 206 and do not interfere with the rotation of the fan unit 100.

The configuration of the engagement members 210 may differ depending on the type of fan unit 100 to be mounted. Some fan units 100 are axial fans where the top can be the air inlet or air outlet. For example, an axial fan unit 100 has a square shape, sides of up to 200 mm each, and a height or depth of up to 100 mm or up to 50 mm. Some fan units 100 are radial or centrifugal fans, where the top is usually the air inlet and the side is usually the air outlet. For example as shown in FIG. 1C, a radial fan unit 100 has a squarish or circular shape, sides of up to 200 mm each, and a height or depth of up to 100 mm. The radial fan unit 100 has an air outlet 109 its side and has the mounting holes 108 positioned at the air outlet 109.

Figure 9:
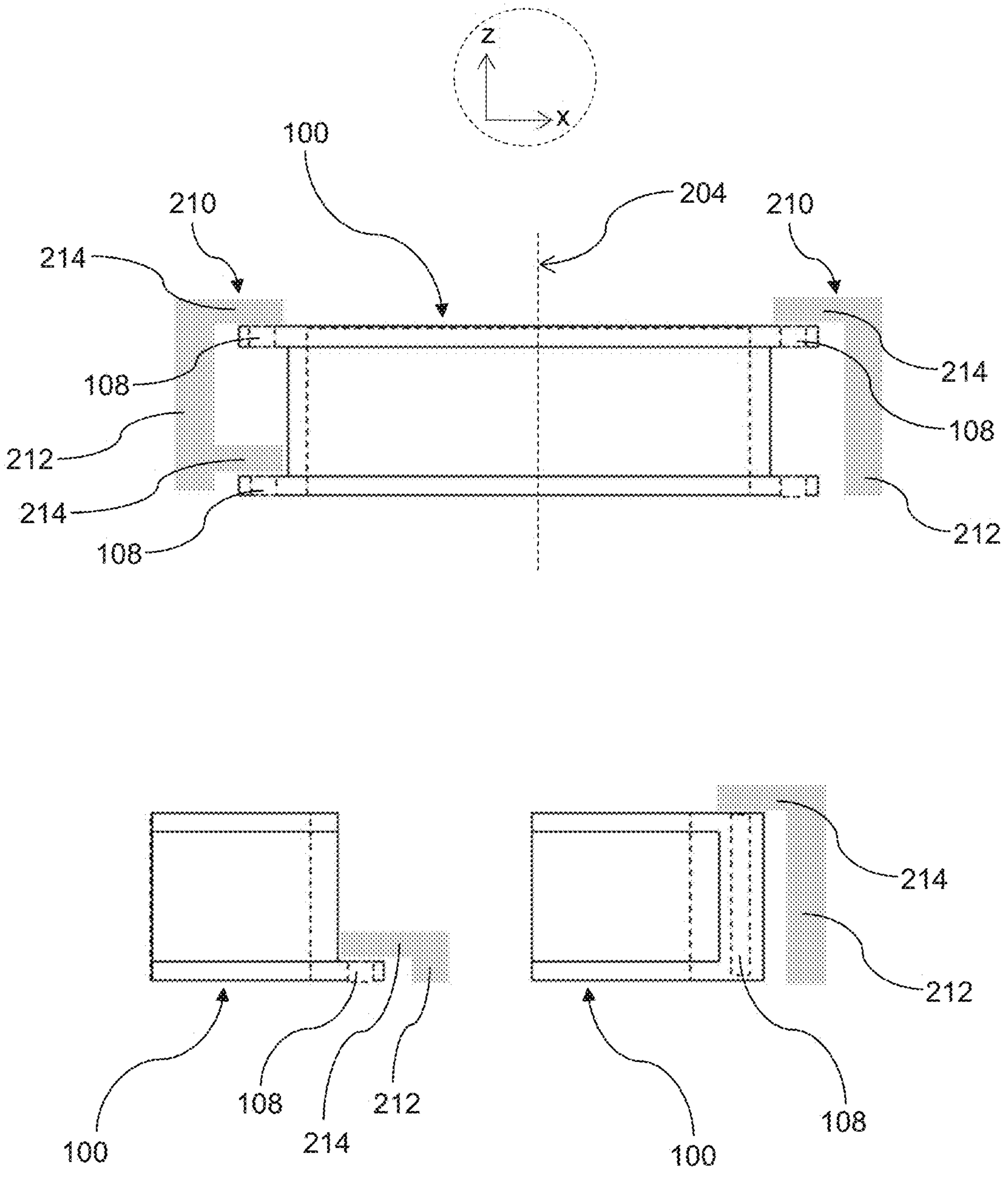
FIG. 9 is an illustration of various configurations of a top bracket of the engagement member.

Some fan units 100 have their mounting holes 108 extending through the top and bottom faces, allowing their fan frames 102 to have dual-sided mounting points. Some fan units 100 have fan frames 102 that have single-sided mounting points. An engagement member 210 may have one or more top brackets 214 extending from the side wall 212, and similarly one or more bottom brackets 216 extending from the side wall 212, depending on the configuration of the fan units 100. FIG. 9 illustrates some examples of the top brackets 214 of the engagement members 210 for various fan units 100.

Figure 10:
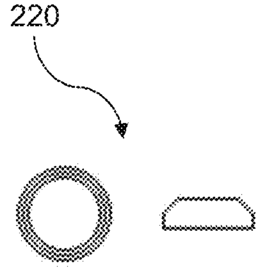
FIG. 10 is an illustration of an engagement element of the mounting device.

As described above, the engagement elements 220 obstruct and interfere with the actuation of the fan unit 100 and some force is necessary to overcome this resistance. The engagement elements 220 are shaped and dimensioned to balance the ease of engaging the fan unit 100 during the actuation, as well as the locking grip on the fan unit 100 upon engagement. FIG. 10 shows an exemplary profile of the engagement element 220. Moreover, upon engagement, the engagement elements 220 are properly fitted into the mounting holes 108 to mitigate rattling or vibrations so that the fan unit 100 remains securely mounted to the mounting device 200. Particularly, for an engagement member 210, the total height (along the reference axis 204) of the engagement elements 220 disposed on the top bracket 214 and/or bottom bracket 216 is not greater than the total deflection of the engagement member 210 during actuation of the fan unit 100.

Figure 11:
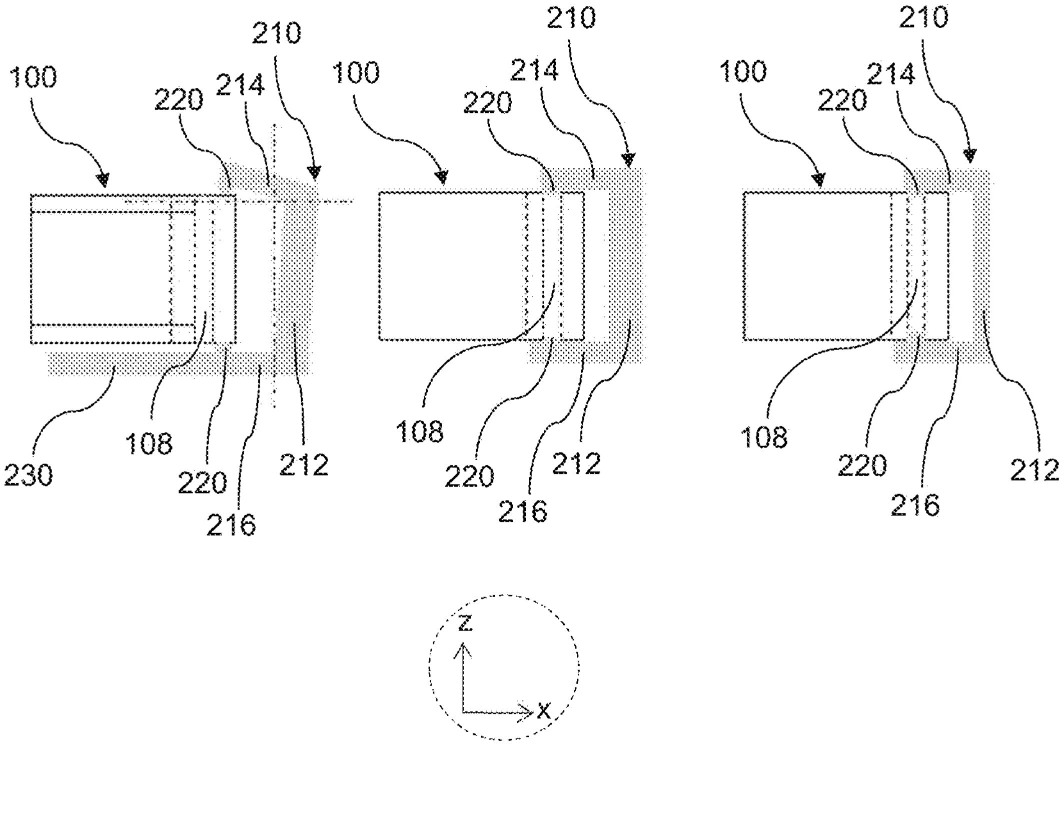
FIG. 11 to FIG. 13 are further illustrations of various configurations of the engagement member.

The magnitude of deflection is dependent on the material and profile of the engagement member 210, particularly the side wall 212 and top bracket 214. For example as shown in FIG. 11, the side wall 212 can be thicker or thinner to increase or decrease the stiffness, respectively.

The mounting device 200 may be made of or include a suitable resilient material for the deflection of the engagement members 210. In some embodiments, the resilient material falls within the hardness range of Shore D 30 to 70 and has an elastic modulus within a predefined range. The materials for the engagement members 210 and engagement elements 220 may be the same or different. For example, the engagement members 210 may be made of or include the resilient material within the hardness range of Shore D 30 to 70, while the engagement elements 220 may be made of or include a softer material within the hardness range of Shore A 20 to 70.

Due to the resilient material, when the fan unit 100 actuates against the engagement members 210 and engagement elements 220, the engagement members 210 resiliently deflects or flexes to allow the engagement elements 220 to engage with the mounting holes 108. The stiffness and deflection of an engagement member 210 can be adjusted by modifying the engagement member 210 with suitable weakening/stiffening elements.

Figure 12:
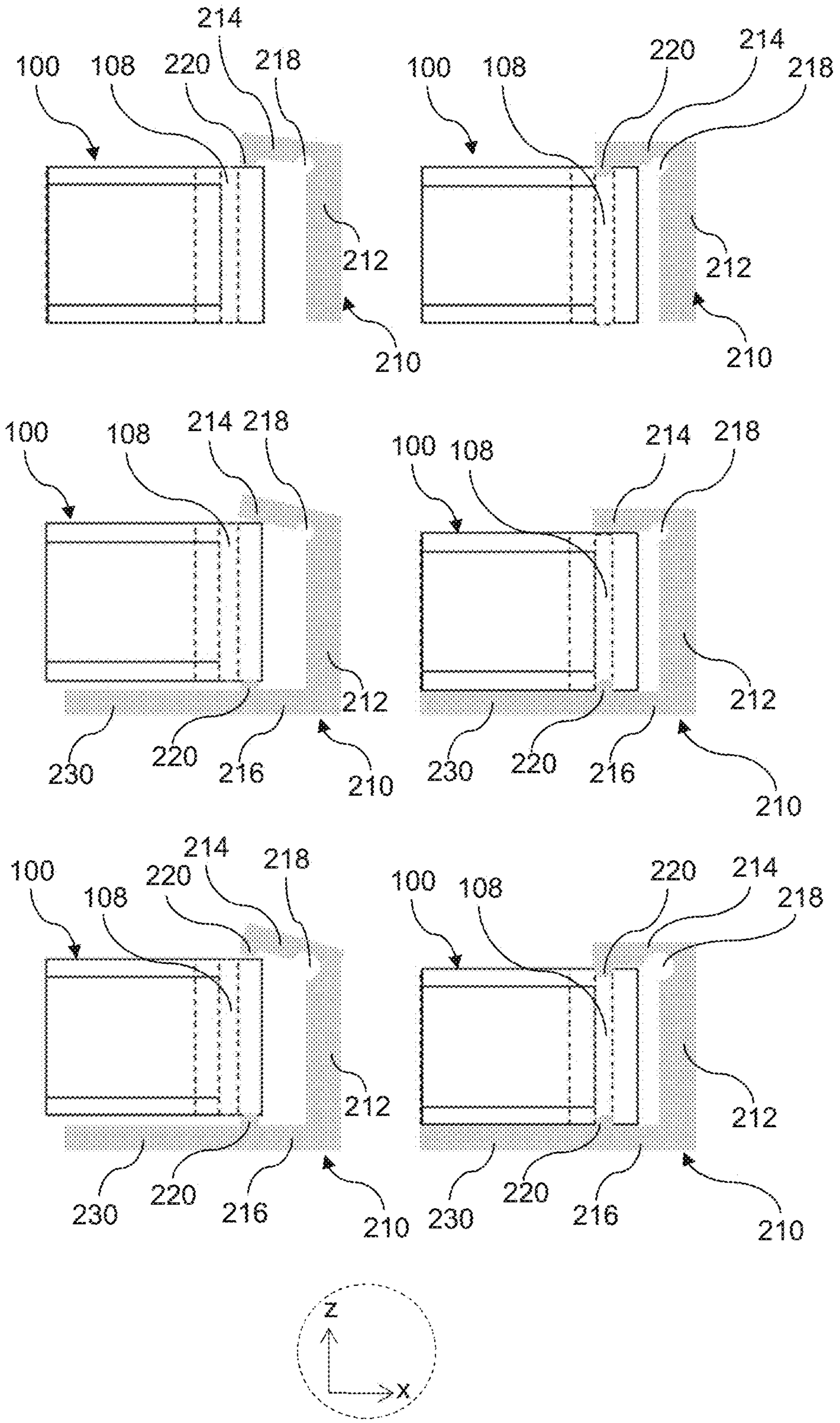

In some embodiments as shown in FIG. 12, the top bracket 214 deflects during this actuation. The engagement member 210 may include a weakening element 218 positioned around the joint between the side wall 212 and top bracket 214. The weakening element 218, which may be a recessed or cut-out portion at the joint, decreases the stiffness of the engagement member 210 and facilitates deflection of the top bracket 214. Conversely, the engagement member 210 may include a stiffening element to increase the stiffness of the engagement member 210.

Figure 13:
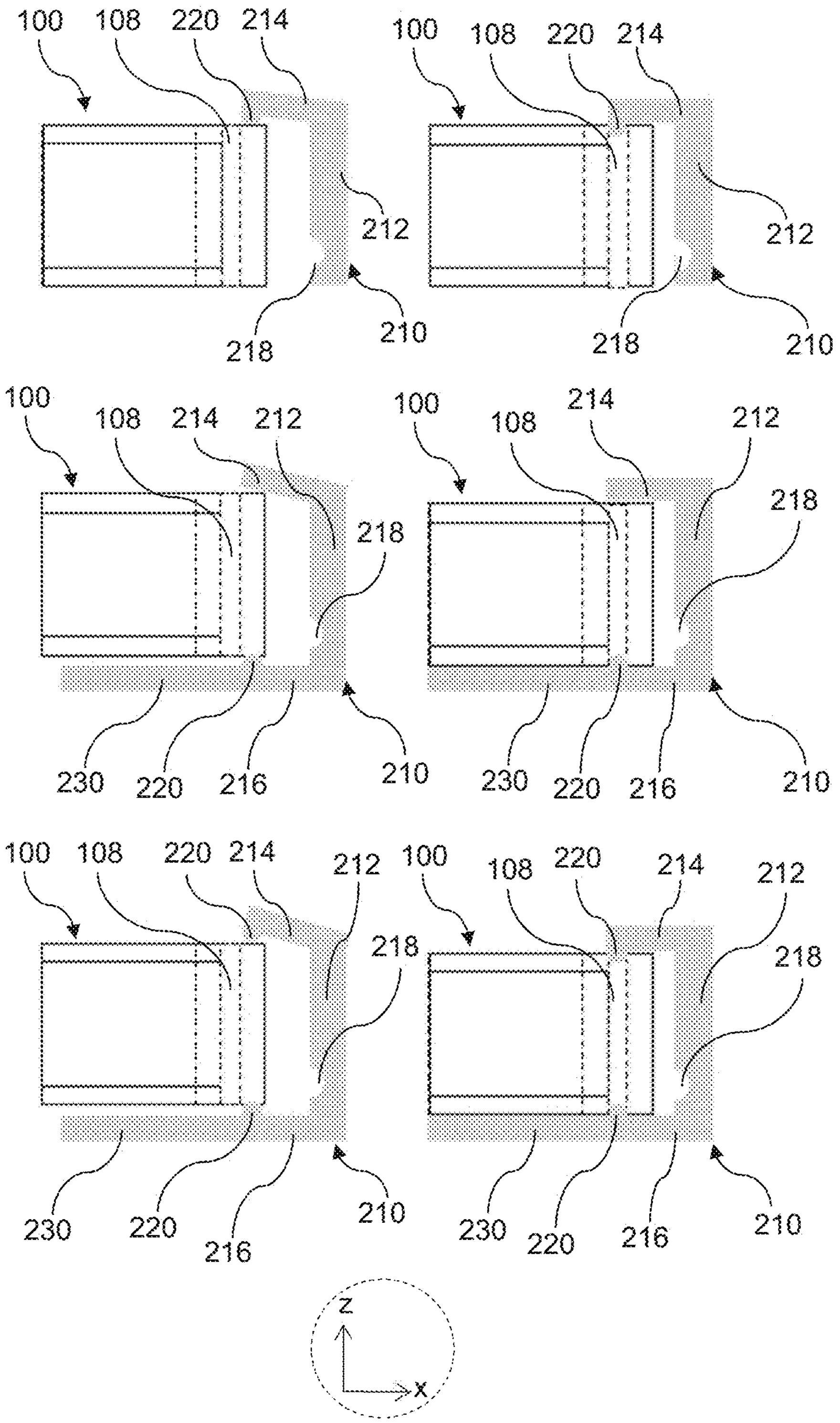

In some embodiments as shown in FIG. 13, the side wall 212 may deflect together with the top bracket 214 during this actuation. The weakening element 218 may be positioned around the joint between the side wall 212 and bottom bracket 216 to facilitate deflection of the side wall 212 and top bracket 214. Positioning the weakening element 218 closer to the bottom bracket 216 further decreases the stiffness as compared to positioning it closer to the top bracket 214, and consequently increases the deflection of the top bracket 214.

Figure 14:
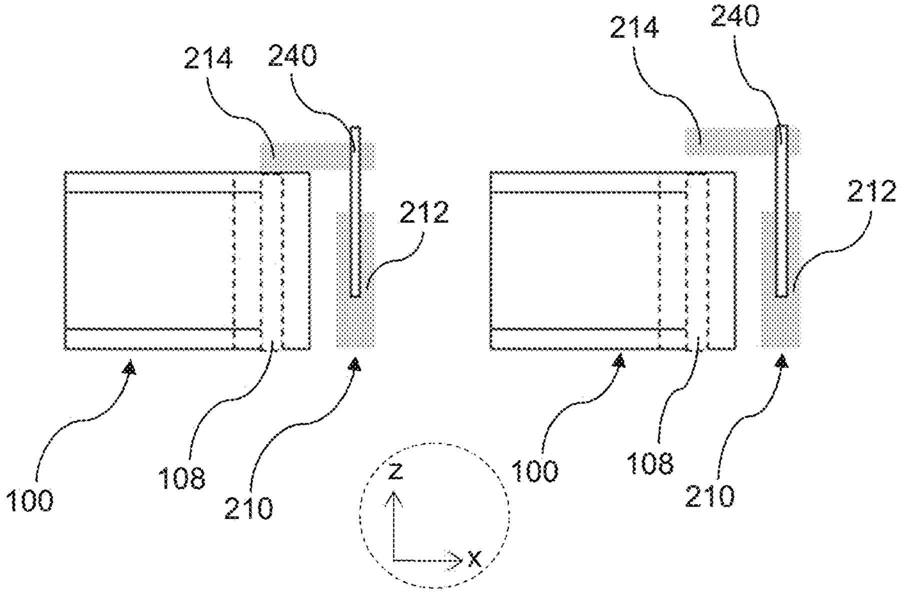
FIG. 14 and FIG. 15 are illustrations of the engagement member having an extension mechanism.

In some embodiments as shown in FIG. 14, an engagement member 210 includes an extension mechanism 240 for adjusting an engagement distance of the engagement member 210. This engagement distance refers to the distance between the top bracket 214 and bottom bracket 216 that clamp onto the fan unit 100. The extension mechanism 2440 enables the engagement member 210 to be configurable to fit fan units 100 of varying dimensions between the top and bottom faces. Some fan units 100 may have a square shape with sides of up to 200 mm and a height or depth (between the top and bottom faces) of up to 100 mm. Some fan units have a shorter height or depth of up to 50 mm.

In one example as shown in FIG. 14, the extension mechanism 240 includes a threaded member coupled to the side wall 212 and top bracket 214. The engagement distance, i.e. the height of the top bracket 214 relative to the bottom bracket 216, can be adjusted upwards or downwards using the threaded member.

Figure 15:
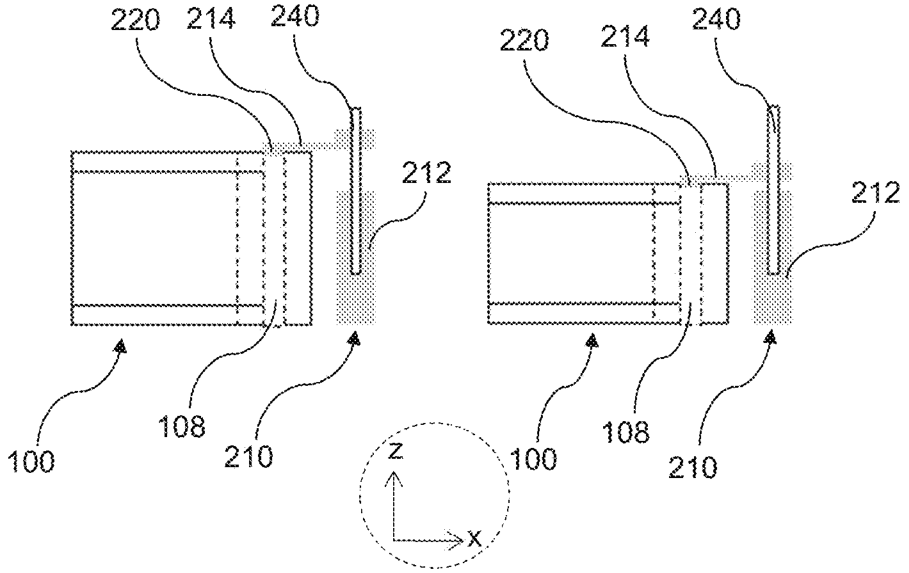

The material for the top bracket 214 may be different from the rest of the engagement member 210. For example, the top bracket 214 may be made of or include a metallic material or alloy. The metallic material has a lower elastic modulus and a higher elastic limit than the material for the rest of the engagement member 210. As shown in FIG. 15, the top bracket 214 may have a thinner profile to decrease the stiffness. For example, the top bracket 214 has a partially ridged profile.

In some embodiments, the mounting device 200 is made of or includes a composite of materials. The composite material includes a first material, such as the resilient material described above, to satisfy the mechanical requirements between flexibility and rigidity so that the engagement members 210 can resiliently deflect and engage with the fan unit 100. The composite material includes a second material (an interfacing material) interfacing between the fan unit 100 and engagement members 210 and optimizes the contact properties between them.

In one embodiment, the interfacing material includes a softer material within the hardness range of Shore 00 0 to 40, and the interfacing material may be porous. The interfacing material may be arranged to seal any gaps between the brackets 214/216 and the faces of the fan unit 100. The interfacing material has a suitable thickness and may optionally be layered to absorb and dampen vibrations produced during operation of the fan unit 100. This attenuation of vibrations can also serve as acoustic absorption to reduce the noise produced by the fan unit 100.

The mounting device 200 may be formed using various manufacturing methods. The mounting device 200 may be formed piecewise and joined or connected together such as using suitable attachment or fastening mechanisms. The mounting device 200 may be integrally formed together as a single body such as by moulding or additive manufacturing.

Figure 16:
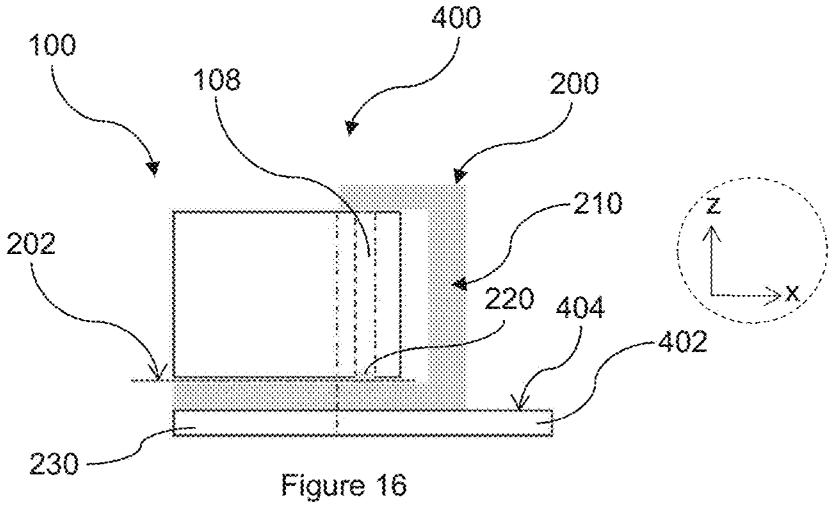
FIG. 16 to FIG. 18 are illustrations of a fan-mounted product having the mounting device.

In various embodiments of the present disclosure, for example as shown in FIG. 16, there is a fan-mounted product 400 including a body 402 and a mounting surface 404 formed on the body 402. The fan-mounted product 400 may be a computer and the body 402 may be the computer motherboard or casing.

The fan-mounted product 400 further includes a mounting device 200 joined to the body 402 and a fan unit 100 mounted to the mounting device 200. In this configuration and as described above, the engagement members 210 and engagement elements 220 are engaged with the respective parts of the fan unit 100 which is in the engaged orientation 120. This engagement resists movement of the fan unit 100 relative to the mounting device 200.

To dismount the fan unit 100 from the mounting device 200, firstly, the fan unit 100 is actuated planarly along the reference plane 202 from the engaged orientation 120 to the disengaged orientation 110. For example, the fan unit 100 is rotated about the reference axis 204. This planar actuation disengages the mounting holes 108 from the engagement elements 220 while retaining the fan unit 100 at the base surface 202. Secondly, the fan unit 100 is removed from the mounting device 200 by displacing the fan unit 100 in the disengaged orientation 110 along the reference axis 204 away from the reference plane 202. Accordingly, the dismounting process is the reverse of the two-stage mounting approach as described for the method 300.

Therefore, without the use of conventional threaded fasteners, the fan unit 100 can be quickly mounted to and dismounted from the mounting device 200. The user can do this using just one hand for quick and easy installation and removal of the fan unit 100, as opposed to having to use two hands for conventional threaded fasteners.

Figure 17:
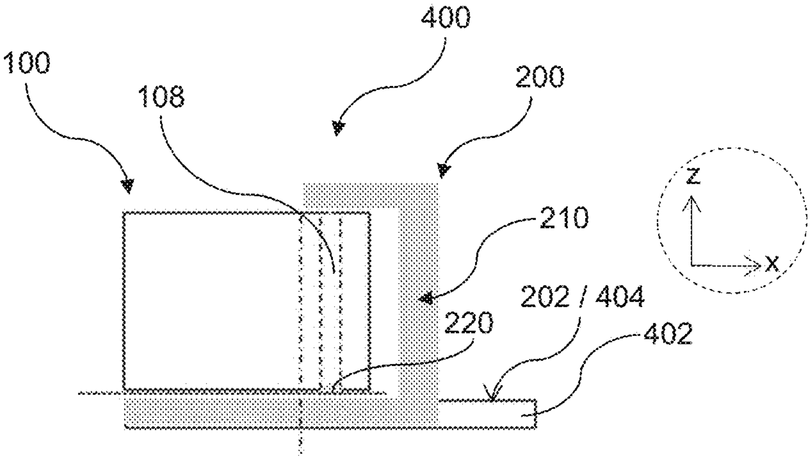

In one embodiment as shown in FIG. 16, the mounting device 200 may include the base member 230 and is joined to the body 402 via the base member 230. Particularly, the base surface of the base member 230 is parallel but noncoplanar with the mounting surface 404. Accordingly, the reference plane 202 which is coplanar with the base surface of the base member 230 is parallel but noncoplanar with the mounting surface 404. In another embodiment as shown in FIG. 17, the mounting device 200 may be joined to the body 402 such that the base surface of the base member 230 and the mounting surface 404 are coplanar. For example, the body 402 has a recess for receiving the base member 230. Accordingly, the reference plane 202 is coplanar with the mounting surface 404 of the body 402 which the fan unit 100 and mounting device 200 are joined to.

Figure 18:
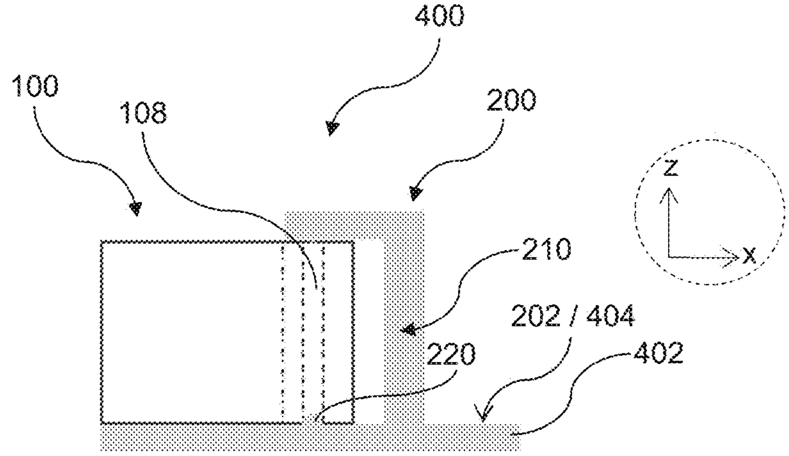

In some embodiments, the mounting device 200 may be separately formed from the body 402 and later coupled to the body 402, such as shown in FIG. 16 and FIG. 17. For example, the mounting device 200 may be coupled using permanent attachment means such as adhesive, bonding, and fastening means. Alternatively, the mounting device 200 may be removably coupled to the body 402, such as using suitable fasteners, allowing it to be removed and replaced. In some other embodiments, the mounting device 200 is integrally formed with the body 402 such as by moulding or additive manufacturing, such as shown in FIG. 18.

Figure 19:
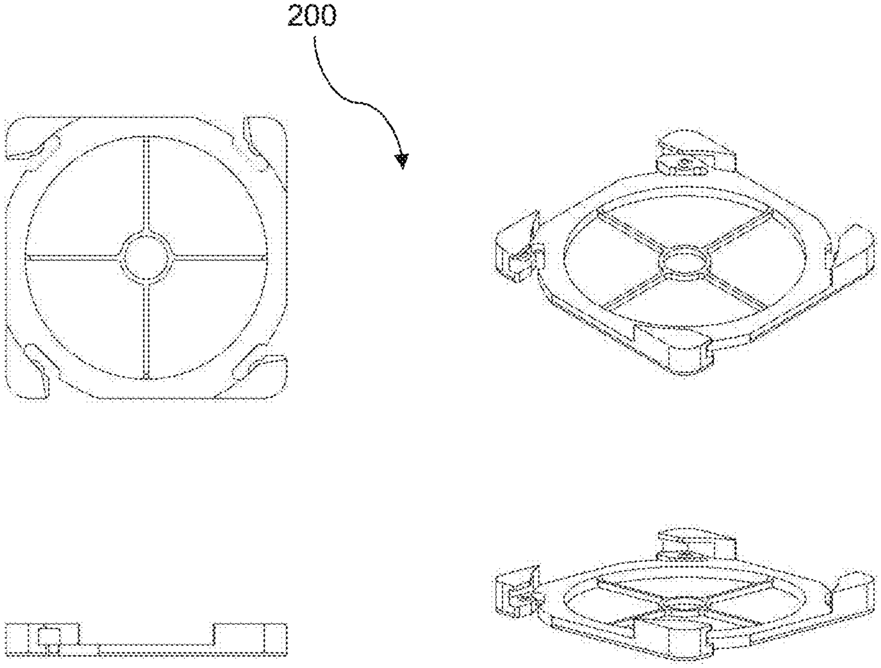
FIG. 19 to FIG. 21 are further illustrations of the mounting device and fan unit.
Figure 20:
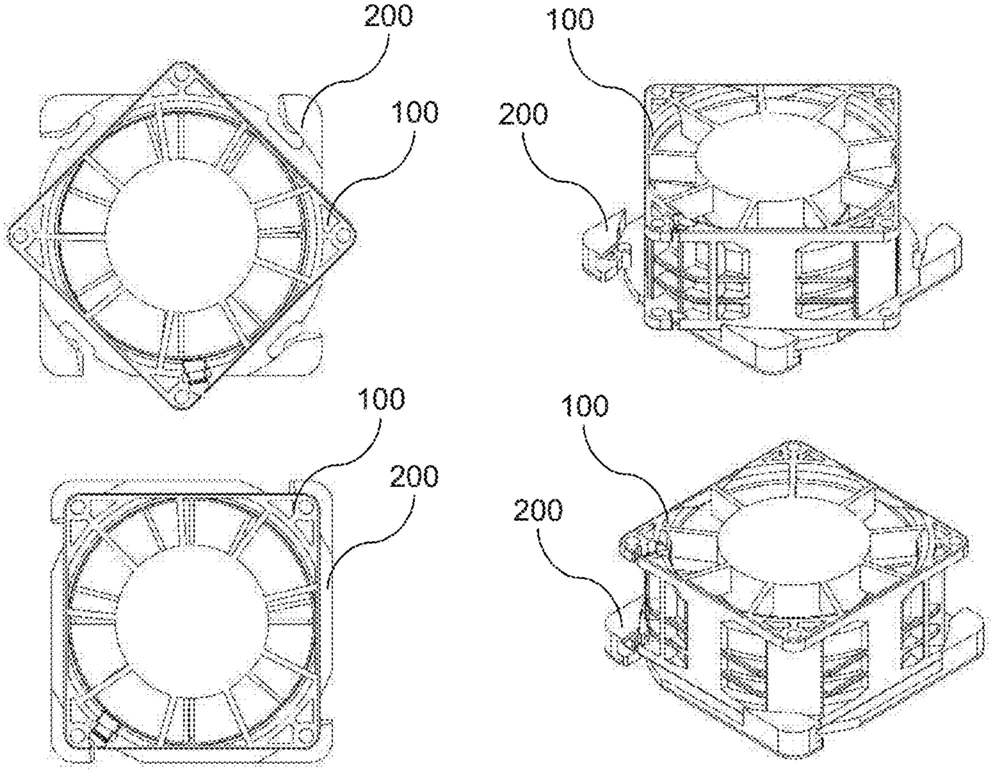
Figure 21:
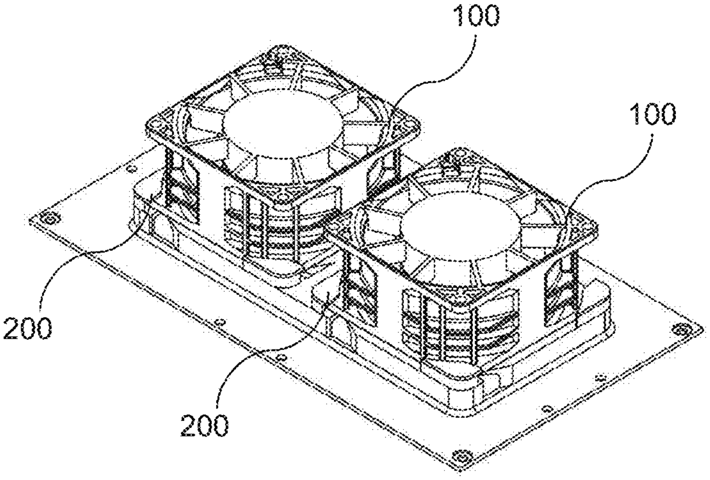

FIG. 19 to FIG. 21 provide further illustrations of the mounting device 200 and with and without the fan unit 100 mounted to it. There are various applications of the mounting device 200 and fan unit 100 other than the computer-related applications mentioned above. In particular, the mounting device 200 and fan unit 100 can be used in electrical systems such as fuel cell systems for air-cooling of heat-generating fuel cells. The mounting device 200 can be tailored to the type/shape of the fan unit 100 used and the type of properties required by the application. Moreover, two (or more) fan units 100 can be mounted to two (or more) mounting devices 200, wherein the mounting devices 200 may be integrally formed as a single unit, such as shown in FIG. 21.

Figure 22:
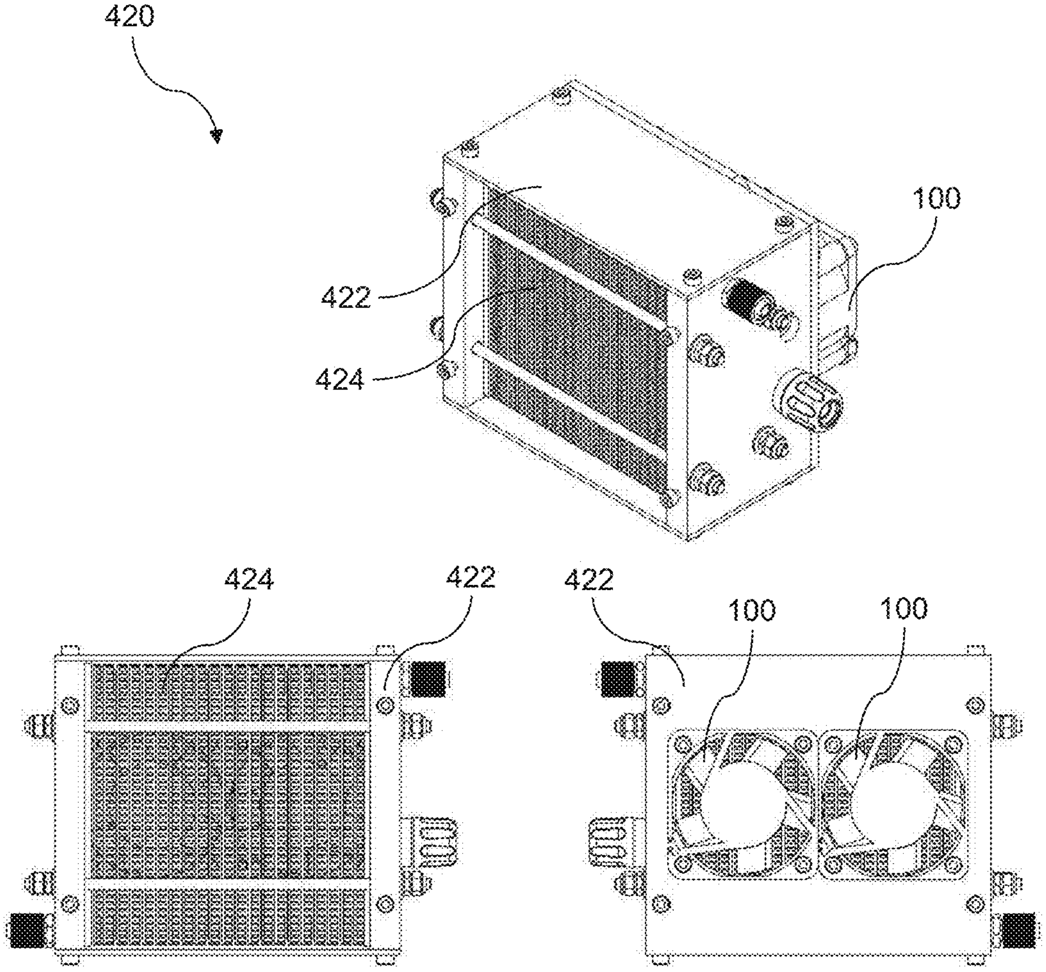
FIG. 22 is an illustration of a fuel cell system with fan units mounted by conventional fasteners.

In one example as shown in FIG. 22, the fan-mounted product 400 is a fuel cell system 420 has a body 422 and fan units 100 joined to the body 422. The fan units 100 may be joined to the body 422 using conventional fasteners such as screws and bolts and nuts. Alternatively, mounting devices 200 may be joined to the body 422 for mounting of the fan units 100. Although FIG. 22 illustrates the fuel cell system 420 having two fan units 100, it will be appreciated that any number of fan units 100 can be included in the fuel cell system 420.

The fuel cell system 420 includes a stack of fuel cells 424 configured for generating electricity. Specifically, a fuel cell 424 is an electrochemical cell that converts chemical energy of a fuel (e.g. hydrogen) and an oxidant (e.g. oxygen) into electricity through redox reactions. Heat is generated by the fuel cells 424 as a by-product from the redox reactions and the fan units 100 work to facilitate dissipation of the heat by delivering cooling air to the fuel cells 424. The fuel cell system 420 has an open-cathode type fuel cell architecture whereby the fan units 100 deliver both cooling air and oxidant to the fuel cells 424. The power output of the fuel cell system 420 is typically below 5 KW so that air cooling from the fan units 100 is usually sufficient to dissipate the generated heat, although it will be appreciated that open-cathode type fuel cell architectures can be used to produce higher power outputs.

Figure 23:
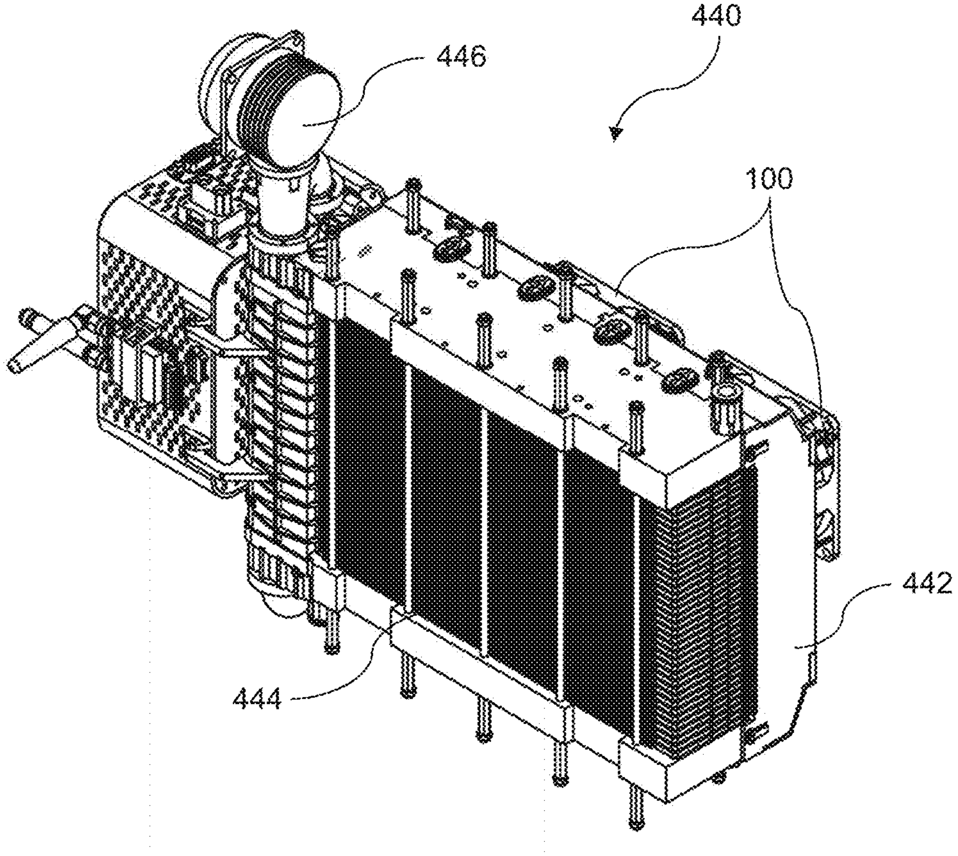
FIG. 23 and FIG. 24 are illustrations of another fuel cell system having the mounting device and fan units.
Figure 24:
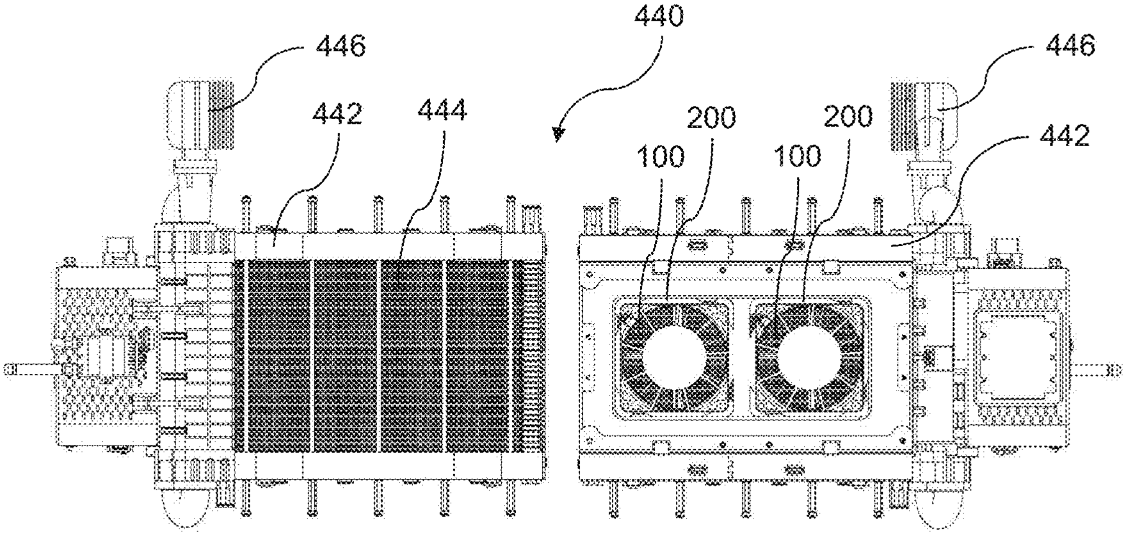

In another example as shown in FIG. 23 and FIG. 24, the fan-mounted product 400 is another fuel cell system 440 having a body 442 and mounting devices 200 joined to the body 442. The mounting devices 200 may be separately formed and joined to the body 442. Alternatively, the mounting devices 200 are integrally formed and joined to the body 442 as a single unit. Yet alternatively, the mounting devices 200 are integrally formed with the body 442. Although FIG. 23 and FIG. 24 illustrate the fuel cell system 440 having two mounting devices 200, it will be appreciated that any number of mounting devices 200 and correspondingly the fan units 100 can be included in the fuel cell system 440.

The fuel cell system 440 also includes a stack of fuel cells 444 configured for generating electricity. However, the fuel cell system 440 has a closed-cathode type fuel cell architecture whereby the fuel cell system 440 further includes a primary oxidant source 446 configured for delivery of oxidant to the fuel cells 444. The primary oxidant source 446 may be a compressor, blower, or radial fan. The primary oxidant source 446 optimises delivery of oxidant and the fuel cells 444 receive oxidant mainly from the primary oxidant source 446, but may also receive some oxidant carried by the cooling air from the fan units 100. As a result of improved/optimised delivery of oxidant, the fuel cell system 440 can produce more power for the same reaction area. With higher power output, the heat generated by the fuel cells 444 would increase and air cooling by the fan units 100 may not be sufficient to dissipate the heat. The fuel cell system 440 may further include a liquid cooling device for liquid cooling the fuel cells 444 in cooperation with the air cooling. For example, the liquid cooling device communicates water or another liquid coolant through flow channels to remove the generated heat from the fuel cells 444.

Examples according to the present disclosure, such as a product comprising the mounting device 200 and optionally with the body 402, may be fabricated by moulding or other known manufacturing methods. Particularly, they may be formed by a manufacturing process that includes an additive manufacturing process. A common example of additive manufacturing is three-dimensional (3D) printing; however, other methods of additive manufacturing are available. Rapid prototyping or rapid manufacturing are also terms which may be used to describe additive manufacturing processes.

As used herein, "additive manufacturing" refers generally to manufacturing processes wherein successive layers of material(s) are provided on each other to "build-up" layer-by-layer or "additively fabricate", a 3D component. This is compared to some subtractive manufacturing methods (such as milling, drilling, or computer numerical control (CNC) machining), wherein material is successively removed to fabricate the part. The successive layers generally fuse together to form a monolithic component which may have a variety of integral sub-components. In particular, the manufacturing process may allow an example of the disclosure to be integrally formed and include a variety of features not possible when using prior manufacturing methods.

Additive manufacturing methods described herein enable manufacture to any suitable size and shape with various features which may not have been possible using prior manufacturing methods. Additive manufacturing can create complex geometries without the use of any sort of tools, moulds, or fixtures, and with little or no waste material. Instead of machining components from solid billets of plastic or metal, much of which is cut away and discarded, the only material used in additive manufacturing is what is required to shape the part.

Suitable additive manufacturing techniques in accordance with the present disclosure include, for example, Fused Deposition Modelling (FDM), Selective Laser Sintering (SLS), 3D printing such as by inkjets and laserjets, Stereolithography (SLA), Direct Selective Laser Sintering (DSLS), Electron Beam Sintering (EBS), Electron Beam Melting (EBM), Laser Engineered Net Shaping (LENS), Electron Beam Additive Manufacturing (EBAM), Laser Net Shape Manufacturing (LNSM), Direct Metal Deposition (DMD), Digital Light Processing (DLP), Continuous Digital Light Processing (CDLP), Direct Selective Laser Melting (DSLM), Selective Laser Melting (SLM), Direct Metal Laser Melting (DMLM), Direct Metal Laser Sintering (DMLS), Material Jetting (MJ), NanoParticle Jetting (NPJ), Drop On Demand (DOD), Binder Jetting (BJ), Multi Jet Fusion (MJF), Laminated Object Manufacturing (LOM), and other known processes.

The additive manufacturing processes described herein may be used for forming components using any suitable material. For example, the material may be metal, plastic, polymer, composite, or any other suitable material that may be in solid, liquid, powder, sheet material, wire, or any other suitable form or combinations thereof. More specifically, according to exemplary embodiments of the present disclosure, the additively manufactured components described herein may be formed in part, in whole, or in some combination of materials suitable for use in additive manufacturing processes and which may be suitable for the fabrication of examples described herein.

As noted above, the additive manufacturing process disclosed herein allows a single component to be formed from multiple materials. Thus, the examples described herein may be formed from any suitable mixtures of the above materials. For example, a component may include multiple layers, segments, or parts that are formed using different materials, processes, and/or on different additive manufacturing machines. In this manner, components may be constructed which have different materials and material properties for meeting the demands of any particular application. In addition, although the components described herein are constructed entirely by additive manufacturing processes, it should be appreciated that in alternate embodiments, all or a portion of these components may be formed via casting, machining, and/or any other suitable manufacturing process. Indeed, any suitable combination of materials and manufacturing methods may be used to form these components.

Additive manufacturing processes typically fabricate components based on 3D information, for example a 3D computer model (or design file), of the component. Accordingly, examples described herein not only include products or components as described herein, but also methods of manufacturing such products or components via additive manufacturing and computer software, firmware or hardware for controlling the manufacture of such products via additive manufacturing.

The structure of the product may be represented digitally in the form of a design file. A design file, or computer aided design (CAD) file, is a configuration file that encodes one or more of the surface or volumetric configuration of the shape of the product. That is, a design file represents the geometrical arrangement or shape of the product.

Design files can take any now known or later developed file format. For example, design files may be in the Stereolithography or "Standard Tessellation Language" (.stl) format which was created for Stereolithography CAD programs of 3D Systems, or the Additive Manufacturing File (.amf) format, which is an American Society of Mechanical Engineers (ASME) standard that is an extensible markup-language (XML) based format designed to allow any CAD software to describe the shape and composition of any 3D object to be fabricated on any additive manufacturing printer. Further examples of design file formats include AutoCAD (.dwg) files, Blender (.blend) files, Parasolid (.x_t) files, 3D Manufacturing Format (0.3mf) files, Autodesk (3ds) files, Collada (.dae) files and Wavefront (.obj) files, although many other file formats exist.

Design files can be produced using modelling (e.g. CAD modelling) software and/or through scanning the surface of a product to measure the surface configuration of the product. Once obtained, a design file may be converted into a set of computer executable instructions that, once executed by a processer, cause the processor to control an additive manufacturing apparatus to produce a product according to the geometrical arrangement specified in the design file. The conversion may convert the design file into slices or layers that are to be formed sequentially by the additive manufacturing apparatus.

The instructions (otherwise known as geometric code or "G-code") may be calibrated to the specific additive manufacturing apparatus and may specify the precise location and amount of material that is to be formed at each stage in the manufacturing process. As discussed above, the formation may be through deposition, through sintering, or through any other form of additive manufacturing method.

The code or instructions may be translated between different formats, converted into a set of data signals and transmitted, received as a set of data signals and converted to code, stored, etc., as necessary. The instructions may be an input to the additive manufacturing system and may come from a part designer, an intellectual property (IP) provider, a design company, the operator or owner of the additive manufacturing system, or from other sources. An additive manufacturing system may execute the instructions to fabricate the product using any of the technologies or methods disclosed herein.

Design files or computer executable instructions may be stored in a (transitory or non-transitory) computer readable storage medium (e.g., memory, storage system, etc.) storing code, or computer readable instructions, representative of the product to be produced. As noted, the code or computer readable instructions defining the product that can be used to physically generate the object, upon execution of the code or instructions by an additive manufacturing system. For example, the instructions may include a precisely defined 3D model of the product and can be generated from any of a large variety of well-known CAD software systems such as AutoCAD®, TurboCAD®, DesignCAD 3D Max, etc. Alternatively, a model or prototype of the product may be scanned to determine the 3D information of the product. Accordingly, by controlling an additive manufacturing apparatus according to the computer executable instructions, the additive manufacturing apparatus can be instructed to print out the product.

In light of the above, embodiments include methods of manufacture via additive manufacturing. This includes the steps of obtaining a design file representing the product and instructing an additive manufacturing apparatus to manufacture the product according to the design file. The additive manufacturing apparatus may include a processor that is configured to automatically convert the design file into computer executable instructions for controlling the manufacture of the product. In these embodiments, the design file itself can automatically cause the production of the product once input into the additive manufacturing apparatus. Accordingly, in this embodiment, the design file itself may be considered computer executable instructions that cause the additive manufacturing apparatus to manufacture the product. Alternatively, the design file may be converted into instructions by an external computing system, with the resulting computer executable instructions being provided to the additive manufacturing apparatus.

Given the above, the design and manufacture of implementations of the subject matter and the operations described in this specification can be realized using digital electronic circuitry, or in computer software, firmware, or hardware, including the structures disclosed in this specification and their structural equivalents, or in combinations of one or more of them. For instance, hardware may include processors, microprocessors, electronic circuitry, electronic components, integrated circuits, etc. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Although additive manufacturing technology is described herein as enabling fabrication of complex objects by building objects point-by-point, layer-by-layer, typically in a vertical direction, other methods of fabrication are possible and within the scope of the present subject matter. For example, although the discussion herein refers to the addition of material to form successive layers, one skilled in the art will appreciate that the methods and structures disclosed herein may be practiced with any additive manufacturing technique or other manufacturing technology.

In the foregoing detailed description, embodiments of the present disclosure in relation to a mounting device for a fan unit are described with reference to the provided figures. The description of the various embodiments herein is not intended to call out or be limited only to specific or particular representations of the present disclosure, but merely to illustrate non-limiting examples of the present disclosure. The present disclosure serves to address at least one of the mentioned problems and issues associated with the prior art. Although only some embodiments of the present disclosure are disclosed herein, it will be apparent to a person having ordinary skill in the art in view of this disclosure that a variety of changes and/or modifications can be made to the disclosed embodiments without departing from the scope of the present disclosure. Therefore, the scope of the disclosure as well as the scope of the following claims is not limited to embodiments described herein.

The invention claimed is:

1. A mounting device for mounting an axial fan unit, the mounting device comprising:
- a reference plane and a reference axis normal to the reference plane, the axial fan unit being receivable towards the reference plane along the reference axis when the axial fan unit is in a disengaged orientation;
- a set of engagement members radially disposed around the reference axis and arranged to surround the axial fan unit when the axial fan unit is in the disengaged orientation at the reference plane, the engagement members engageable with the axial fan unit upon rotation of the axial fan unit, the rotation being along a first rotational direction about the reference axis from the disengaged orientation to an engaged orientation; and
- a set of engagement elements disposed on the engagement members, the engagement elements engageable within a set of mounting holes of the axial fan unit when the axial fan unit is at the reference plane and upon rotation of the axial fan unit to the engaged orientation,
- wherein when the axial fan unit is in the disengaged orientation at the reference plane, the axial fan unit is rotatable towards the engagement members and is rotatable along both the first rotational direction and a second rotational direction opposing the first rotational direction;
- wherein when the axial fan unit is in the disengaged orientation at the reference plane and upon rotation of the axial fan unit along the second rotational direction, the engagement members prevent engagement of the axial fan unit;
- wherein when the axial fan unit is in the engaged orientation upon rotation of the axial fan unit along the first rotational direction, the engagement members that are engaged with the axial fan unit resist movement of the axial fan unit along the reference axis and the engagement elements that are engaged with the mounting holes of the axial fan unit resist rotation of the axial fan unit about the reference axis; and
- wherein the engaged engagement elements are disengageable from the mounting holes by rotating the axial fan unit along the second rotational direction.

2. The mounting device according to claim 1, wherein the set of engagement members comprises a plurality of engagement members angularly separated from each other about the reference axis.

3. The mounting device according to claim 2, wherein the set of engagement elements comprises a plurality of engagement elements angularly separated from each other about the reference axis and engageable within the mounting holes of the axial fan unit.

4. The mounting device according to claim 1, wherein each engagement member comprises a barrier to:
- prevent rotation of the axial fan unit along the second rotational direction from the disengaged orientation to the engaged orientation, and
- prevent further rotation of the axial fan unit along the first rotational direction when the axial fan unit is in the engaged orientation.

5. The mounting device according to claim 4, further comprising side surfaces for guiding rotation of the axial fan unit.

6. The mounting device according to claim 1, wherein each of the engagement members comprises a side wall and at least one bracket extending from the side wall.

7. The mounting device according to claim 6, wherein the at least one bracket comprises a top bracket and/or a bottom bracket.

8. The mounting device according to claim 1, wherein at least one of the engagement members comprises a weakening or stiffening element for increasing or decreasing, respectively, a stiffness of the respective engagement members.

9. The mounting device according to claim 1, wherein at least one of the engagement members comprises an extension mechanism for adjusting an engagement distance of the respective engagement members, and wherein the extension mechanism optionally comprises a threaded member.

10. The mounting device according to claim 1, wherein the engagement members and/or engagement elements include a resilient material within a hardness range of Shore D 30 to 70 or wherein the engagement elements include a resilient material within a hardness range of Shore A 20 to 70.

11. The mounting device according to claim 1, wherein the mounting device includes an interfacing material for interfacing between the axial fan unit and the set of engagement members, the interfacing material within a hardness range of Shore 00 0 to 40.

12. A computer program comprising computer executable instructions that, when executed by a processor, cause the processor to control an additive manufacturing apparatus to manufacture a product comprising the mounting device according to claim 1.

13. A method of manufacturing a product via additive manufacturing, the method comprising:
- obtaining an electronic file representing a geometry of the product wherein the product comprises the mounting device according to claim 1; and
- controlling an additive manufacturing apparatus to manufacture, over one or more additive manufacturing steps, the product according to the geometry specified in the electronic file.

14. A fan-mounted product comprising:
- a body;
- the mounting device according to claim 1 and joined to the body; and
- the axial fan unit mounted to the mounting device.

15. The fan-mounted product according to claim 14, wherein the mounting device is integrally formed with the body.

16. The fan-mounted product according to claim 14, wherein the fan-mounted product is a fuel cell system comprising a stack of fuel cells.

17. The fan-mounted product according to claim 16, wherein the axial fan unit is configured for delivering cooling air and oxidant to the fuel cells.

18. The fan-mounted product according to claim 16, wherein the fuel cell system further comprises a primary oxidant source for delivering oxidant to the fuel cells.

19. The fan-mounted product according to claim 18, wherein the fuel cell system further comprises a liquid cooling device for liquid cooling the fuel cells.

* * * * *